(12) United States Patent
Shimizu et al.

(10) Patent No.: US 10,705,165 B2
(45) Date of Patent: Jul. 7, 2020

(54) MAGNETIC RESONANCE SIGNAL DETECTION MODULE

(71) Applicants: National Institute for Materials Science, Tsukuba (JP); JEOL Ltd., Tokyo (JP)

(72) Inventors: Tadashi Shimizu, Tsukuba (JP); Takashi Mizuno, Tokyo (JP); Mitsuru Toda, Tokyo (JP); Takahiro Nemoto, Tokyo (JP); Hideo Shino, Tokyo (JP)

(73) Assignees: JEOL Ltd., Tokyo (JP); National Institute for Materials Science, Ibaraki (JP)

( * ) Notice: Subject to any disclaimer, the term of this patent is extended or adjusted under 35 U.S.C. 154(b) by 134 days.

(21) Appl. No.: 16/033,506

(22) Filed: Jul. 12, 2018

(65) Prior Publication Data

US 2019/0025388 A1     Jan. 24, 2019

(30) Foreign Application Priority Data

Jul. 24, 2017     (JP) .................................. 2017-142801

(51) Int. Cl.
| | | |
|---|---|---|
| *G01R 33/34* | (2006.01) | |
| *G01R 33/30* | (2006.01) | |
| *G01R 33/36* | (2006.01) | |
| *G01R 33/31* | (2006.01) | |

(52) U.S. Cl.
CPC ..... *G01R 33/34092* (2013.01); *G01R 33/307* (2013.01); *G01R 33/31* (2013.01); *G01R 33/34015* (2013.01); *G01R 33/3403* (2013.01); *G01R 33/34007* (2013.01); *G01R 33/34053* (2013.01); *G01R 33/34069* (2013.01); *G01R 33/3635* (2013.01)

(58) Field of Classification Search
CPC .............. G01R 33/34092; G01R 33/31; G01R 33/34015; G01R 33/307; G01R 33/34069; G01R 33/34053; G01R 33/34007; G01R 33/3403; G01R 33/3635
See application file for complete search history.

(56) References Cited

U.S. PATENT DOCUMENTS

| | | | |
|---|---|---|---|
| 7,915,893 B2 | 3/2011 | Shevgoor et al. | |
| 2006/0152221 A1* | 7/2006 | Doty .................... | G01R 33/307 324/318 |
| 2008/0297156 A1* | 12/2008 | Suematsu ........ | G01R 33/34046 324/318 |
| 2013/0271141 A1* | 10/2013 | Zhang .............. | G01R 33/34092 324/318 |
| 2014/0055138 A1 | 2/2014 | Takegoshi et al. | |

OTHER PUBLICATIONS

Extended European Search Report dated Dec. 14, 2018 in EP18182990.4.

* cited by examiner

*Primary Examiner* — Tung X Nguyen
*Assistant Examiner* — Feba Pothen
(74) *Attorney, Agent, or Firm* — The Webb Law Firm

(57) ABSTRACT

A magnetic resonance signal detection module includes an insulator block having a coil mounting section including a through hole serving as a detection hole into which a sample container is inserted. A low-frequency coil is provided on an inner surface of the through hole. A high-frequency primary resonator is embedded in the coil mounting section so as to surround the low-frequency coil.

7 Claims, 19 Drawing Sheets

MAGNETIC RESONANCE SIGNAL DETECTION MODULE

CROSS-REFERENCE TO RELATED APPLICATION

This application claims priority to Japanese Patent Application No. 2017-142801 filed Jul. 24, 2017, the disclosure of which is hereby incorporated in its entirety by reference.

BACKGROUND OF THE INVENTION

Field of the Invention

The present disclosure relates to a magnetic resonance signal detection module provided in a nuclear magnetic resonance probe (NMR probe).

Description of Related Art

A detection system cooling NMR probe, which may be called "cryoprobe," is known as one type of the NMR probe. The detection system cooling NMR probe includes a vacuum container in which individual constituent components (particularly, a detection system) are kept in a low-temperature state. Among various constituent components to be cooled, a specifically important component is a detection module configured to detect nuclear magnetic resonance signals. Conventionally, for example, the detection module includes a bobbin, and a coil wound around an outer peripheral surface of the bobbin. A heat exchanger capable of cooling the detection system is disposed in the vacuum container. When a measurement target is a solid sample, a sample tube accommodating this solid sample is rotatably disposed in an inclined state so as to keep a predetermined inclined angle (so-called magic angle: $\theta m \approx 54.74°$ inside a cylindrical partition wall of the vacuum container. The sample tube can rotate at higher speeds during sample measurement. In this case, the sample itself is kept at room temperature, while the detection system (particularly, the detection module) in the vacuum container is kept in a low-temperature state as mentioned above. The sample temperature for measurement may be set to an arbitrary temperature. In addition to the above-mentioned detection module, constituent components to be cooled in the vacuum container include, for example, detection circuit elements (such as variable and fixed capacitors), a transmitting/receiving signal switcher (duplexer), a preamplifier, a directional coupler, a coaxial cable, a radiation shield, and the like.

FIG. 1 illustrates a detection system cooling NMR probe as a comparative example to be compared to some embodiments described below. The NMR probe illustrated in FIG. 1 includes an insertion part 14 inserted in a bore 12 of a magnetic field generator 10. A probe head 16 and a probe body 18 constitute the insertion part 14. A vacuum container 20 constitutes a partition wall. A thermally insulated vacuum space 22 is present in the vacuum container 20. A sleeve 24 serving as the cylindrical partition wall is provided at an upper part of the vacuum container 20. A sample tube 26 can be inserted and rotatably placed in an inner passage of the sleeve 24. The sample tube 26 is held in an inclined state at a predetermined angle. A mechanism for transmitting a rotational force to the sample tube 26 is provided at each end of the sample tube 26. The inner passage of the sleeve 24 is kept at atmospheric pressure and at room temperature. The inside of the vacuum container 20 is in a vacuum state, and each constituent component disposed therein is in a low-temperature state. A detection module, constituting an essential part or a core part of the detection system, is disposed in the probe head 16. As shown in the illustrated example, the detection module is composed of an insulator block 28 and a transmitting/receiving coil 30. The transmitting/receiving coil 30 is a coil having a solenoid shape (i.e., a solenoid coil). The transmitting/receiving coil 30 applies a high-frequency magnetic field to a sample, to detect a signal representing nuclear magnetic resonance generated by the sample. The insulator block 28 is connected to a heat exchanger 32. The insulator block 28 has a cylindrical through hole formed therein, and the transmitting/receiving coil 30 is provided on an inner circumferential surface of the through hole. The above-mentioned sleeve 24 is provided in the transmitting/receiving coil 30, to place the sample tube 26 in a space kept at room temperature and under atmospheric pressure. For example, gaseous helium is introduced into the heat exchanger 32, thereby cooling the heat exchanger 32 down to an extremely low-temperature (e.g., 4K). The heat exchanger 32 is thermally connected to the transmitting/receiving coil 30 via the insulator block 28, so that the transmitting/receiving coil 30 can be cooled.

In the drawing, $Z_0$ defines a direction parallel to a static magnetic field formed by the magnetic field generator 10. Further, $Y_0$ defines a direction in which the sample tube 26 extends, when the sample tube 26 is projected on a plane orthogonal to the $Z_0$ direction, and $X_0$ defines a direction orthogonal to both the $Z_0$ direction and the $Y_0$ direction. Further, Y is a newly defined axis that can be obtained by rotating the $Y_0$ axis around the $X_0$ axis by an angle $|90°-\theta m|$ so as to coincide with the direction along which the sample tube 26 extends. Z is a newly defined axis that can be obtained by rotating the $Z_0$ axis around the $X_0$ axis by the angle $|90°-\theta m|$. X is a newly defined axis as being identical to the $X_0$ axis. The sample tube 26 is held in the inclined state so that the direction (major axis) along which the sample tube 26 extends coincides with the Y-axis. Thus, the sample tube 26 is disposed inclinedly so as to have the so-called magic angle.

FIG. 2 illustrates an exemplary circuit of the detection system cooling NMR probe, as a comparative example. The transmitting/receiving coil 30, a tuning variable capacitor 34, a balance variable capacitor 36, a matching variable capacitor 38, a transmission line (coaxial cable for extremely low-temperature) 40, a duplexer 42, and a preamplifier 44 are provided in the vacuum container 20. These constituent components are cooled in the vacuum container 20, to improve NMR signal detection sensitivity. Further, a transmitting port 46 is connected to the duplexer 42, and a receiving port 48 is connected to the preamplifier 44. The duplexer 42, when operating in a transmission mode, sends a transmission signal received from a spectrometer via the transmitting port 46 to the transmitting/receiving coil 30. The duplexer 42, when operating in a reception mode, sends an NMR signal detected by the transmitting/receiving coil 30 to the preamplifier 44. The preamplifier 44 amplifies the NMR signal and sends the amplified NMR signal to the spectrometer via the receiving port 48.

An NMR probe using a so-called cross-coil is conventionally proposed. For example, U.S. Pat. No. 7,915,893 B discloses a solenoid coil for low-frequency nuclide (e.g., $^{13}C$ nucleus or $^{15}N$ nucleus) and a solenoid coil for high-frequency nuclide (e.g., $^{1}H$ nucleus) that cooperatively constitute a cross-coil. These coils are air core coils.

When a measuring target is a solid sample, to apply a high-frequency oscillating field to the sample, high-frequency power of 100 W level may be transmitted to the NMR probe in some cases. When high-frequency power is applied to an LC resonance circuit, a standing wave is generated in the circuit, and a potential difference depending on the impedance is generated. In other words, a spatial distribution including spots higher and spots lower in electric field intensity appears, thereby causing a gradient in electric field.

If the gradient in electric field between two spatially separated electrodes becomes sufficiently large to exceed a threshold value, high-frequency current tends to flow between the two electrodes through emitted electrons and ionized gas caused by them, rather than flowing through a passive element connecting the electrodes in the circuit. The threshold voltage at this moment is referred to as discharge-starting voltage.

When the electric discharge starts, the potential balance of standing wave breaks down. Therefore, the high-frequency oscillating field having an intensity to be inherently applied to the sample cannot be obtained, resulting in not only unreliable measurement results but also occurrence of noises due to the electric discharge during the observation of NMR signal, which deteriorate the sensitivity of an obtained NMR signal. Therefore, ensuring prevention of electric discharge in the circuit when applying the high-frequency oscillating field to the sample is a fundamental requirement in a technical aspect, especially in performances of the NMR probe for solid sample measurement.

In general, to maintain the temperature of the transmitting/receiving coil at an extremely low temperature, the transmitting/receiving coil is disposed in a vacuum space thermally insulated from a room temperature environment.

In the case of high-frequency irradiation in vacuum, the discharge-starting voltage varies depending on the degree of vacuum. In general, when a pair of electrodes (two electrodes opposed to each other) is placed in an atmosphere of ordinary gas (e.g., nitrogen, oxygen, hydrogen, argon, or air), the discharge-starting voltage and "gas pressure x inter-electrode distance" are in a relationship determined by mass of ionized gas and mean free path of gas molecules (Paschen's law), to have the following relationship according to the degree of vacuum.

In an atmospheric pressure region (pressure $P>10^{+3}$ Pa), there will be a chance of generating an ionized gas by electrons given to a gas in contact with an electrode surface. However, in such a case, since the mean free path is short, electrons are deprived when the ionized gas travels the distance to a counter electrode while colliding with other gases. Electric discharge seldom occurs between the electrodes. In general, the discharge-starting voltage is high.

In a low-vacuum region ($10^{+3}$ Pa>pressure $P>10^{+2}$ Pa), the mean free path of a gas becomes longer in inverse proportion to the pressure. This will increase a possibility that an ionized gas may directly collide with the counter electrode without any collision with other gases while traveling the distance to the counter electrode. When the distance between the electrodes is constant, the discharge-starting voltage monotonously decreases with decreasing pressure.

In a medium vacuum region ($10^{+2}$ Pa>pressure $P>10^{-1}$ Pa), since the mean free path of a gas does not increase so much, the discharge-starting voltage hardly changes when the pressure drops.

In a high-vacuum region ($10^{-1}$ Pa>pressure $P>10^{-5}$ Pa), the mean free path of a gas is substantially constant. The density of a gas in contact with an electrode surface decreases in proportion to the pressure. Since the amount of ionized gas for propagation of discharging decreases, the discharge-starting voltage monotonously increases with decreasing pressure.

The above-mentioned contents can be summarized as follows. More specifically, when a graph is drawn with a vertical axis representing the discharge-starting voltage of a gas and a horizontal axis representing the above-mentioned "gas pressurexinter-electrode distance," the graph becomes a convex curve (Paschen curve) protruding downwardly and having a minimum value at a point adjacent to 1 [Pa·cm].

In a conventional NMR probe, the degree of vacuum in a thermally insulated vacuum space can be maintained at $10^{-4}$ Pa or less at room temperature. In addition, an O-ring sealing assures airtightness sufficient for maintaining a high-vacuum region of, for example, $10^{-4}$ Pa at room temperature and $10^{-5}$ Pa in a low-temperature operation.

However, when the voltage applied between electrodes is a high-frequency alternating voltage, the relationship between the discharge-starting voltage and the degree of vacuum is different from that in a case where a direct current voltage is applied. Even though a higher vacuum is maintained, such a relationship induces a factor lowering the discharge-starting voltage, as a mechanism referred to as multipactor discharge. More specifically, due to a functional relationship between the inter-electrode distance, gas translation speed, and alternating frequency, the relationship between the discharge-starting voltage and "frequency x inter-electrode distance" shows unique behavior in the high-vacuum region.

In general, when a supposed model includes a power source sandwiched between two electrodes, the potential difference between the electrodes is always constant without causing any temporal variation in the case of direct-current type. However, the electric potential of each electrode varies depending on the frequency in the case of alternating-current type. In this case, secondary electrons when emitted from the electrode surface are attracted toward the counter electrode. However, reversing the potential of the counter electrode at this moment enables the electrons to advance oppositely toward the original electrode. From the foregoing, it is easily predictable that there will be a certain frequency at which electrons can easily reach the counter electrode, in consideration of a relationship between electron emission speed, inter-electrode distance, and electrode alternating frequency. The electrons having reached the counter electrode hit a metal surface to emit secondary electrons. The emitted secondary electrons reach the original electrode to further emit secondary electrons. Such processes promote the electric discharge between the electrodes and result in dielectric breakdown. The phenomenon of multiple collisions of electrons repetitively occurring between high-frequency alternating electrodes in a higher vacuum is referred to as multipactor discharge.

Multipactor discharge has been discovered in research and development of high-frequency oscillators and amplifiers of mainly in the VHF band or above (300 MHz to 1 GHz). Since electrons themselves emit electrodes sustaining the discharging, increasing the degree of vacuum causes no essential change in the discharge-starting voltage. Although it is conceivable to make the inter-electrode distance approximately ten times, employing such an arrangement is difficult industrially (actually), because the magnitude of a superconducting magnetic field determines the size of the NMR probe. Further, a contact point of metal, insulator, and vacuum on a solid surface is generally referred to as a triple junction, at which the multipactor discharge tends to occur because of steep gradient in electric field. More specifically, in a state where the electrodes (e.g., a low-frequency nuclide coil and a high-frequency nuclide coil) are exposed to a vacuum space, the conventional NMR probe has extreme difficulty causing pulse irradiation of high frequency in the VHF band or higher having a field intensity of several hundreds V/mm, at a higher duty cycle, without generating any discharge. In other words, when a cross-coil includes a low-frequency nuclide coil and a high-frequency nuclide coil, causing pulse irradiation with no accompanying discharge between the coils is difficult in a state where conductor surfaces of these coils are exposed to vacuum.

SUMMARY OF THE INVENTION

The present disclosure is directed to a magnetic resonance signal detection module including a low-frequency nuclide coil and a high-frequency nuclide coil, and intends to prevent occurrence of electric discharge that may otherwise be caused by high-frequency current supplied to the coils.

An aspect of the present disclosure is a magnetic resonance signal detection module provided in a vacuum container to be inserted in a static magnetic field generator and detecting a magnetic resonance signal from a sample, including an insulator block having a detection hole into which a sample container can be inserted, a low-frequency nuclide coil provided on an inner surface of the detection hole, and a high-frequency nuclide coil embedded in the insulator block in such a way as to surround the low-frequency nuclide coil.

According to the above-mentioned configuration, embedding the high-frequency nuclide coil in the insulator block can prevent occurrence of electric discharge between the high-frequency nuclide coil and the low-frequency nuclide coil. Since the resonance frequency is variable depending on an observation target nuclide, a high-frequency signal having a specific frequency matching the nuclide to be observed is given to the coil. For example, a high-frequency signal whose frequency matches a low-frequency nuclide (e.g., $^{13}C$ or $^{15}N$) is given to the low-frequency nuclide coil. A high-frequency signal whose frequency matches a high-frequency nuclide (e.g., $^{1}H$) is given to the high-frequency nuclide coil. The magnetic resonance signal detection module having the above-mentioned configuration may be applied to various sequences. For example, giving the high-frequency signal whose frequency matches the high-frequency nuclide to the high-frequency nuclide coil can cause the high-frequency nuclide coil to supply a magnetic field to a sample. Meanwhile, giving the high-frequency signal whose frequency matches the low-frequency nuclide to the low-frequency nuclide coil can cause the low-frequency nuclide coil to supply a magnetic field to the sample. Thus, the low-frequency nuclide coil can detect an NMR signal output from the sample. Needless to say, detecting an NMR signal from the high-frequency nuclide and detecting an NMR signal from the low-frequency nuclide may be performed simultaneously. In addition, the insulator block may be cooled by coolant. In this case, cooling both the low-frequency nuclide coil and the high-frequency nuclide coil can improve the detection sensitivity of the NMR signal.

The high-frequency nuclide coil may be configured to include a Helmholtz coil part including a pair of saddle coils and a tuning capacitor part connecting the pair of saddle coils, wherein the pair of saddle coils may be provided in such a way as to sandwich the low-frequency nuclide coil.

The low-frequency nuclide coil and the Helmholtz coil part may be arranged in such a manner that the direction of a magnetic field formed by the low-frequency nuclide coil is orthogonal to the direction of a magnetic field formed by the Helmholtz coil part.

The above-mentioned configuration can reduce a mutual inductance between the low-frequency nuclide coil and the high-frequency nuclide coil. As a result, interference between a low-frequency nuclide side circuit and a high-frequency nuclide side circuit can be suppressed, and isolation (solitary) of both circuits can be enhanced. In addition, magnetic field irradiation efficiency and NMR signal detection efficiency can be enhanced.

A conductor of the low-frequency nuclide coil and a conductor of the Helmholtz coil part may be configured as a coil having a ribbon-like shape, and a flatwise face of a ribbon forming the conductor of the low-frequency nuclide coil and an edgewise face of a ribbon forming the conductor of the Helmholtz coil part may face each other.

The above-mentioned configuration can reduce an area of a confronting portion between the low-frequency nuclide coil and the high-frequency nuclide coil. Therefore, capacitive coupling generated between the low-frequency nuclide coil and the high-frequency nuclide coil can be reduced. As a result, interference between a low-frequency nuclide side circuit and a high-frequency nuclide side circuit can be suppressed, and isolation of both circuits can be enhanced. In addition, magnetic field irradiation efficiency and NMR signal detection efficiency can be enhanced.

The magnetic resonance signal detection module may further include a power supply coil provided outside the vacuum container for supplying electric power to the high-frequency nuclide coil by inductive coupling with the Helmholtz coil part.

Impedance matching may be controlled for supplying electric power according to the distance between the power supply coil and the high-frequency nuclide coil.

The magnetic resonance signal detection module may further include a dielectric provided so as to face the capacitor part, and tuning of resonant frequency may be performed according to the distance between the capacitor part and the dielectric.

The high-frequency nuclide coil may be embedded in a groove formed in the insulator block, and the high-frequency nuclide coil may have a surface exposed from the insulator block and coated with an insulating material.

According to the present disclosure, in a magnetic resonance signal detection module including a low-frequency nuclide coil and a high-frequency nuclide coil, it is feasible to prevent occurrence of electric discharge that may be caused by high-frequency current supplied to the coils.

BRIEF DESCRIPTION OF THE DRAWINGS

Embodiment(s) of the present disclosure will be described by reference to the following figures, wherein.

DESCRIPTION OF THE INVENTION

First Embodiment

Figure 3:
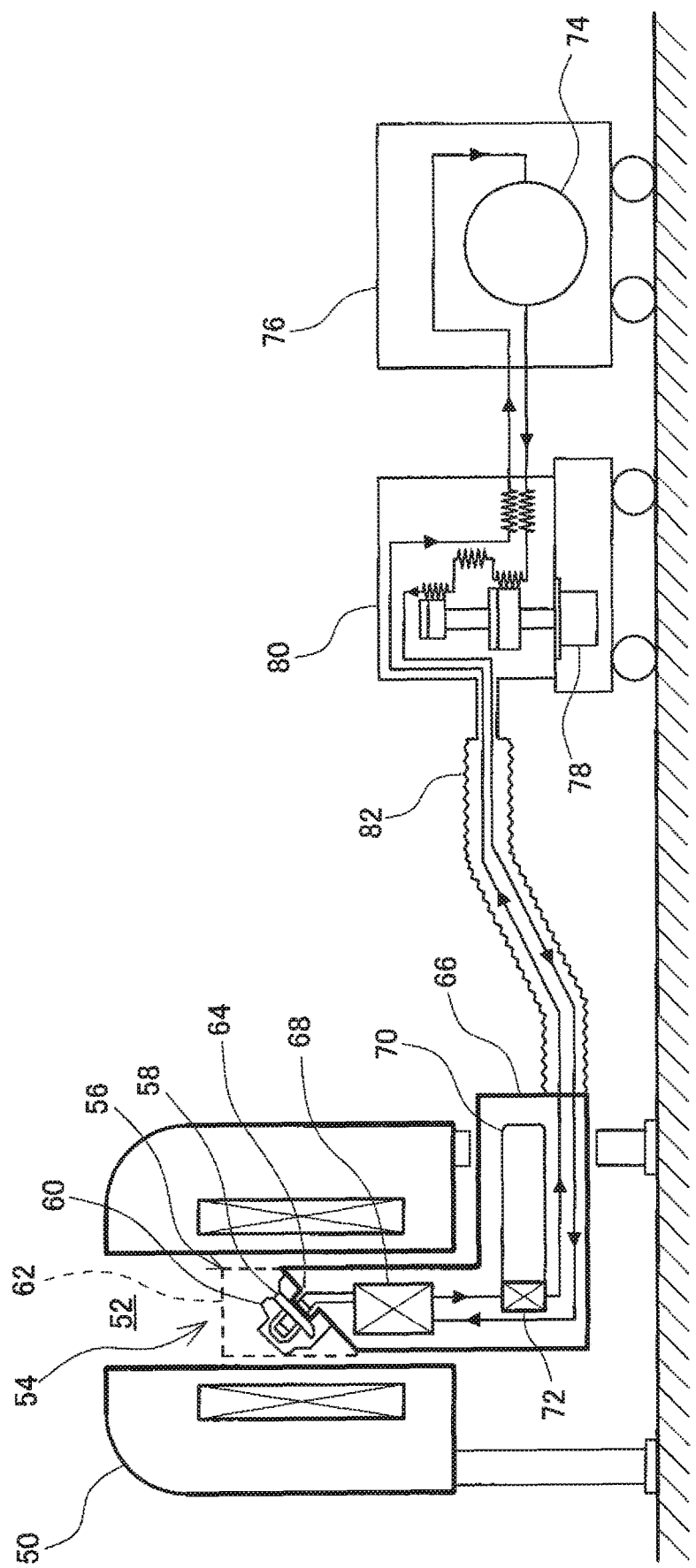
FIG. 3 illustrates a configuration example of an NMR spectrometer system according to a first embodiment.

FIG. 3 illustrates an example of an NMR spectrometer system according to a first embodiment.

Figure 1:
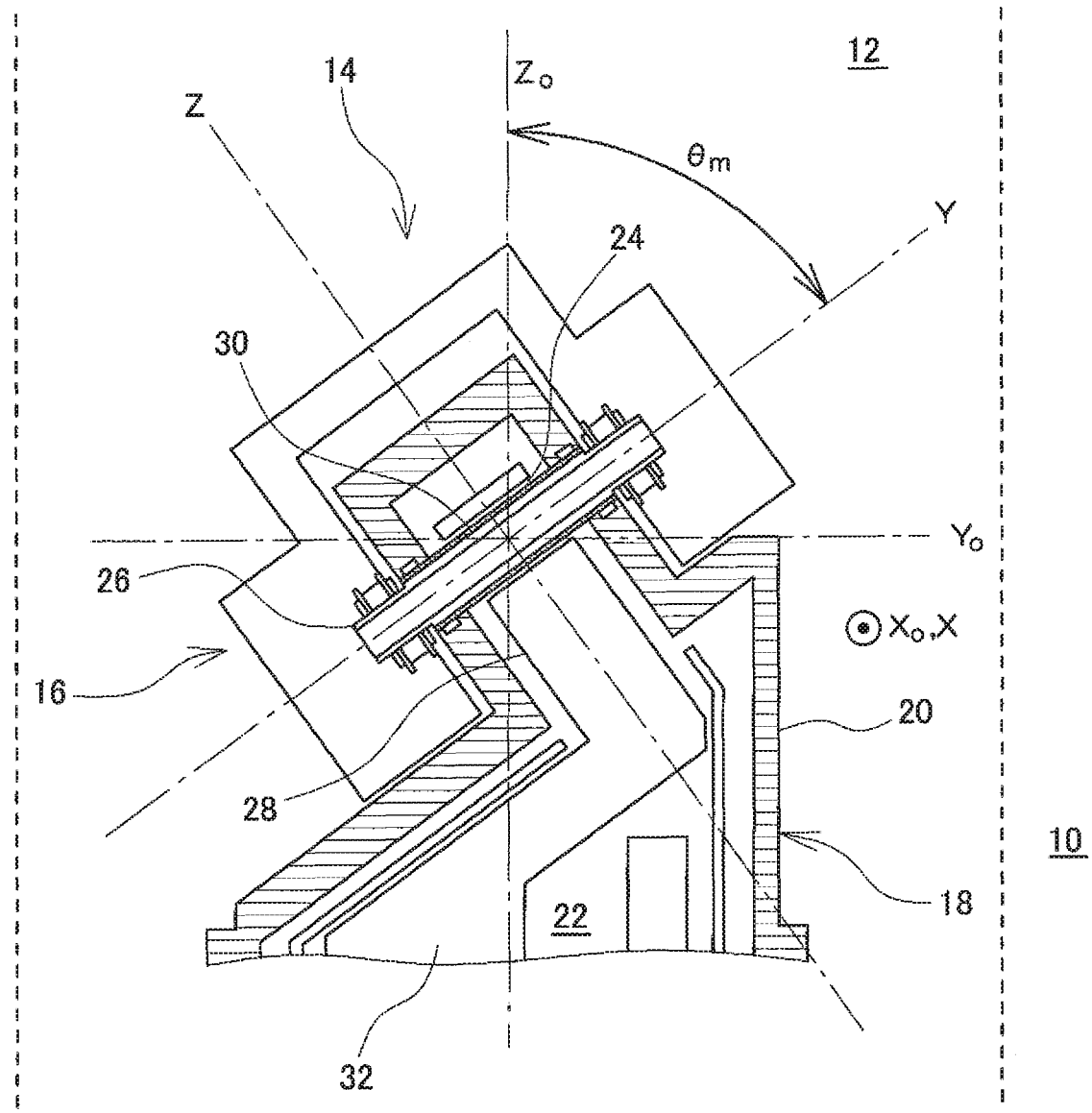
FIG. 1 is a cross-sectional view illustrating a detection system cooling NMR probe according to a comparative example.
Figure 2:
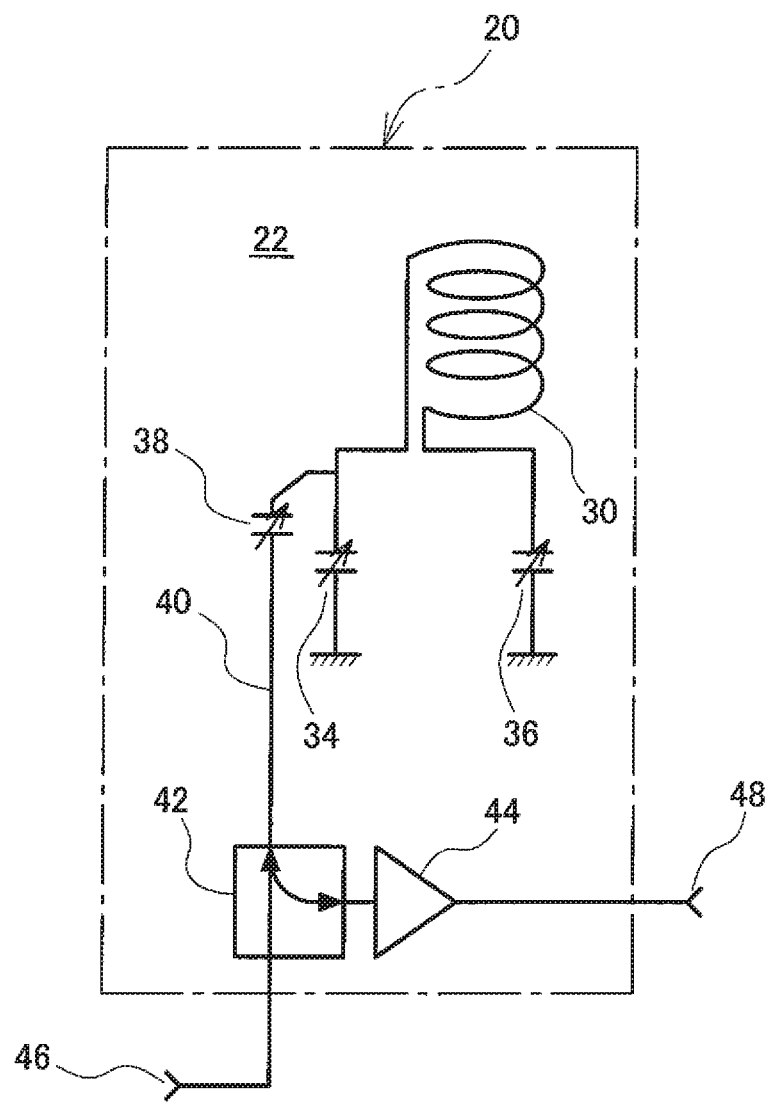
FIG. 2 illustrates a circuit configuration of the detection system cooling NMR probe according to the comparative example.

An NMR probe 54 serving as a detection system cooling NMR probe according to the first embodiment has an insertion part 56 (an upper part of the probe) that can be inserted in a bore 52 of a magnetic field generator 50. The insertion part 56 includes a space kept at atmospheric pressure and room temperature, in which a sample tube 58 can be disposed. In the first embodiment, a measurement target accommodated in the sample tube 58 is a solid sample. The sample tube 58 is disposed at the center of a static magnetic field formed by the magnetic field generator 50. A sample rotating mechanism 60, which is installed in a space kept at atmospheric pressure and room temperature, rotates the sample tube 58 at a predetermined rotational speed. A metal RF shield 62 capable of preventing detection of external noises surrounds the sample rotating mechanism 60. A detection module 64 (primary detection system) including a transmitting/receiving coil for detecting an NMR signal from a sample is installed in the vicinity of the sample tube 58, in a vacuum container 66 constituting a partition wall, and is thermally connected to a first heat exchanger 68 so that the detection module 64 can be cooled. Except for the detection module 64, the NMR probe 54 may have a configuration similar to that of the NMR probe according to the comparative example illustrated in FIG. 1. A lower part of the NMR probe 54 (a lower part of the probe) includes a secondary detection system, which is constituted by a duplexer 70 serving as a transmitting/receiving signal switcher, a preamplifier for amplifying an NMR signal detected by the detection module 64 (primary detection system), and the like, and is thermally connected to a second heat exchanger 72 so that the secondary detection system can be cooled. The above-mentioned constituent components to be cooled (i.e., the detection module 64 and the secondary detection system) are accommodated in the vacuum container 66. Reducing the pressure inside the vacuum container 66 to a higher vacuum by a vacuum pump can suppress the inflow of heat from an atmospheric pressure space to the vacuum container 66. As a result, efficient cooling can be realized.

For example, a circulating cooling system can be employed to realize the above-mentioned cooling. The circulating cooling system is, for example, configured to include a room-temperature gas circulation system 76, in which a gas circulation pump 74 is disposed in a room-temperature space, and a gas cooling system 80 for cooling a coolant gas by heat exchange with a GM refrigerator 78. The circulating cooling system is, for example, connected to the piping in the NMR probe 54 via a transfer tube 82, so as to form a closed cycle circuit.

Gaseous helium is a coolant generally used. First, in the first heat exchanger 68 of the NMR probe 54, the coolant gas cooled by the cooling system exchanges heat with the detection module 64 (primary detection system), which is a constituent component to be cooled. Next, in the second heat exchanger 72, the coolant gas exchanges heat with the secondary detection system, which is a constituent component to be cooled. Subsequently, the coolant gas is returned to the cooling system, in which the coolant gas is heated up to room temperature by the heat exchanger. Then, the circulating pump of the room-temperature gas circulation system 76 presses and recirculates the coolant gas. Usually, it requires approximately 6 hours after turning on the power source of the GM refrigerator 78 until the temperature of each constituent component to be cooled in the NMR probe 54 reaches the minimum temperature. Performing NMR measurement stably for a long time (e.g., 30 days), after the temperature of each constituent component to be cooled has reached the minimum temperature, is also feasible. Needless to say, the above-mentioned cooling system and numerical values are mere examples. Another cooling system having a different configuration may be employed. The time required to reach the minimum temperature is variable depending on the cooling system selected.

In addition, the NMR spectrometer system includes a spectrometer capable of analyzing an NMR signal detected by the NMR probe 54.

Figure 4:
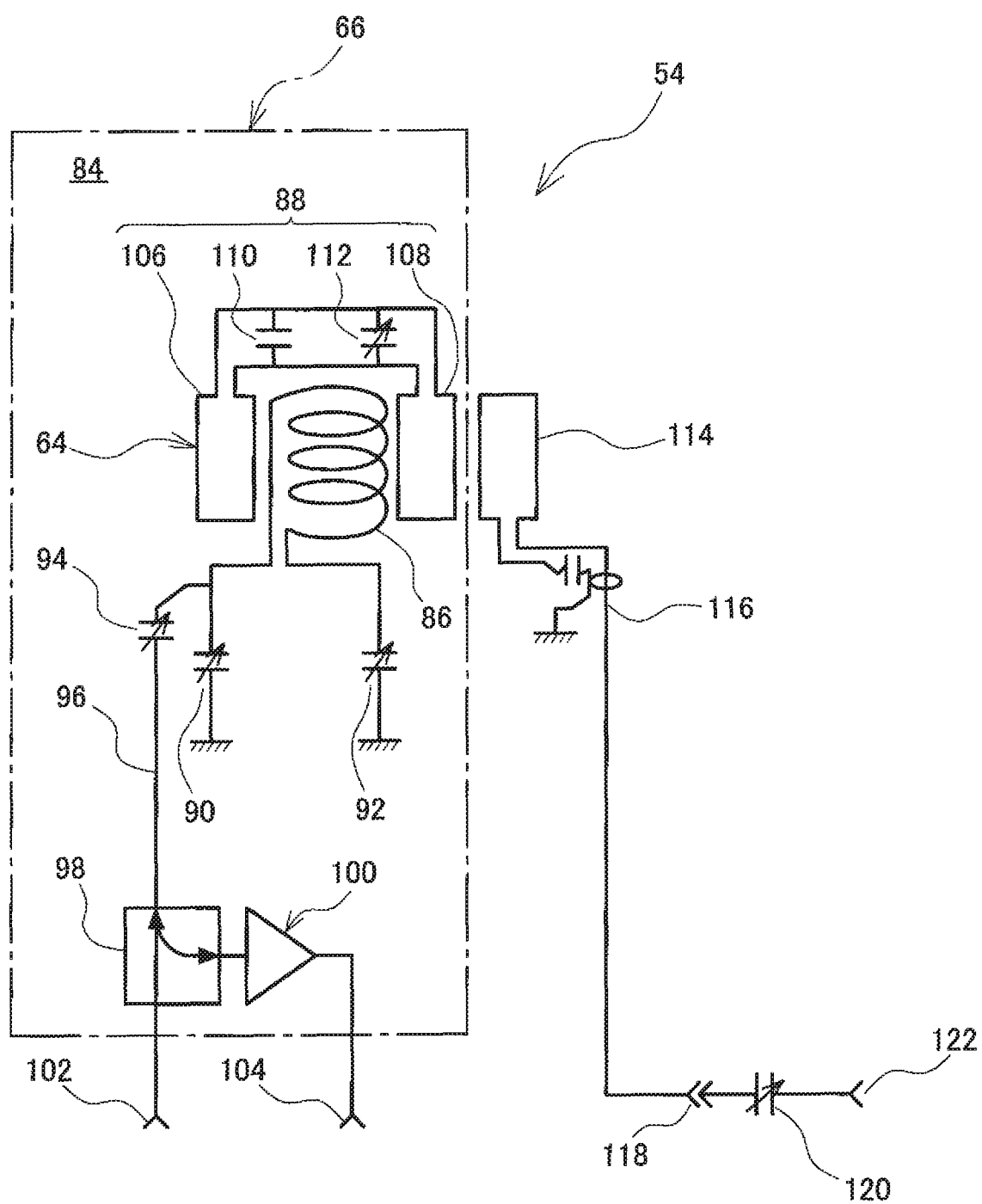
FIG. 4 illustrates a circuit configuration of the detection system cooling NMR probe according to the first embodiment.

Hereinafter, an exemplary circuit configuration of the NMR probe 54 according to the first embodiment will be described in detail with reference to FIG. 4. The NMR probe 54 includes a low-frequency nuclide coil and a high-frequency nuclide coil, which cooperatively constitute a cryogenic cross-coil.

The vacuum container 66 includes a thermally insulated vacuum space 84, in which an LF coil 86 serving as the low-frequency nuclide coil, an HF primary resonator 88 serving as the high-frequency nuclide coil, an LF tuning variable capacitor 90, an LF balance variable capacitor 92, an LF matching variable capacitor 94, an LF transmission line (coaxial cable for extremely low temperature) 96, a duplexer 98, and a preamplifier 100 are provided. These constituent components can be cooled in the vacuum container 66, so that the detection sensitivity of the NMR signal can be improved. The detection module 64 includes the LF coil 86 and the HF primary resonator 88.

The LF coil 86 is, for example, a solenoid coil and constitutes a part of the cryogenic cross-coil. The LF coil 86 has one end to which the LF tuning variable capacitor 90 is connected, so that the LF coil 86 is grounded via the LF tuning variable capacitor 90. The LF coil 86 has the other end to which the LF balance variable capacitor 92 is connected, so that the LF coil 86 is grounded via the LF balance variable capacitor 92. The arrangement described above is for performing the tuning. In addition, the one end of the LF coil 86 is connected to the LF matching variable capacitor 94, as a configuration for performing the matching. The one end of LF coil 86 is connected, via the LF matching variable capacitor 94, to the LF transmission line 96 and is further connected, via the LF transmission line 96, to the duplexer 98 and the preamplifier 100. These constituent components can be cooled in the thermally insulated vacuum space 84. Lowering the temperature of a conductor portion of the LF coil 86 to an extremely low temperature can improve the detection sensitivity of an NMR signal of low-frequency nuclide (LF). In addition, an LF transmitting port 102 is connected to the duplexer 98, and an LF receiving port 104 is connected to the preamplifier 100. The duplexer 98, when operating in a transmission mode, sends to the LF coil 86 a transmission signal received from the spectrometer via the LF transmitting port 102. The duplexer 98, when operating in a reception mode, sends to the preamplifier 100 an NMR signal detected by the LF coil 86. The preamplifier 100 amplifies the NMR signal and sends the amplified NMR signal, via the LF receiving port 104, to the spectrometer.

The HF primary resonator 88, in a mounted state, surrounds the LF coil 86. The HF primary resonator 88 includes a Helmholtz coil constituted by a pair of saddle coils (saddle coils 106 and 108), and further includes a capacitor 110 and a tuning variable capacitor 112 provided between the saddle coils 106 and 108. These constituent components are arranged to constitute an LC resonance circuit and can be cooled in the thermally insulated vacuum space 84. The configuration for lowering the temperature of the conductor portion of the LF coil 86 to an extremely low temperature can prevent adverse influence on the detection sensitivity of the NMR signal of low-frequency nuclide (LF). An HF secondary coil 114 is movably provided outside the vacuum container 66, so as to correspond to the HF primary resonator 88. The HF primary resonator 88 is wirelessly coupled with the HF secondary coil 114. The HF secondary coil 114 is connected, via an HF transmission line (coaxial cable) 116, to an HF transmitting/receiving port 118. Thus, the HF primary resonator 88 is electrically connected to the HF transmitting/receiving port 118, via the HF secondary coil 114 and the HF transmission line 116. In addition, the HF transmitting/receiving port 118 is connected to an HF transmitting/receiving port 122 via an HF matching variable capacitor 120. The HF transmitting/receiving port 122 is electrically connected to the spectrometer. The above-mentioned configuration can irradiate the sample with high-frequency electromagnetic waves emitted from the HF primary resonator 88.

Figure 5:
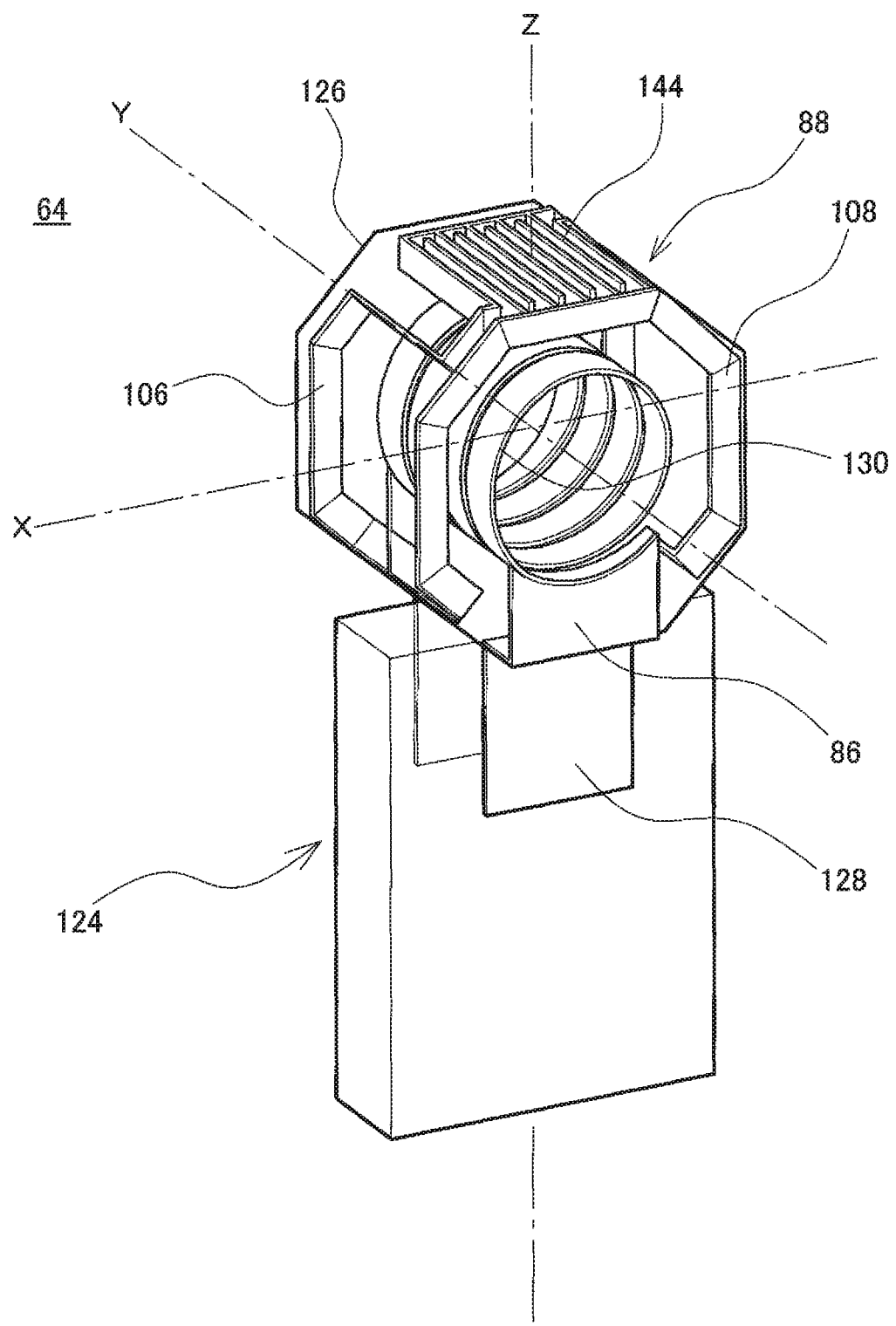
FIG. 5 is a perspective view illustrating the detection module according to the first embodiment.

Hereinafter, the detection module 64 will be described in detail with reference to FIG. 5. FIG. 5 is a perspective view illustrating the detection module 64. The detection module 64 includes an insulator block 124, the LF coil 86, and the HF primary resonator 88. The insulator block 124 includes a coil mounting section 126 and a protrusion 128 protruding from the coil mounting section 126. The coil mounting section 126 includes a through hole 130 formed as an example of a detection hole. The LF coil 86 is provided on an inner surface of the through hole 130. The HF primary resonator 88 is embedded in the coil mounting section 126 in such a way as to surround the LF coil 86. For example, the LF coil 86 may be exposed from the inner surface of the through hole 130 or may be embedded in the coil mounting section 126. The insulator block 124 has a low dielectric constant and a low dielectric loss as an insulator, and is desirably constituted by a substance excellent in thermal conductivity at a lower temperature (e.g., 20 K or below), and is typically constituted by high purity (e.g., 99.9%) sapphire or alumina. The detection module 64 is a constituent component to be cooled. The insulator block 124, the LF coil 86, and the HF primary resonator 88 can be cooled in a state where the heat exchanger is thermally connected to the protrusion 128. For example, thermally connecting the protrusion 128 to the first heat exchanger 68 illustrated in FIG. 3 can cool the detection module 64.

The through hole 130 defines a space into which the sample tube 58 can be inserted. The detection module 64 is inclinedly disposed in the NMR probe 54 so that a direction along which the through hole 130 extends coincides with the Y-axis. Such an arrangement is for holding the sample tube 58 in an inclined state so as to have a so-called magic angle.

The LF coil 86 serves as a transmitting/receiving coil for transmitting or receiving an NMR signal of a low-frequency nuclide (e.g., $^{13}C$ nucleus or $^{15}N$ nucleus) contained in the sample. The HF primary resonator 88 serves as a transmitting/receiving coil for transmitting or receiving an NMR signal of a high-frequency nuclide (e.g., $^{1}H$) contained in the sample.

Figure 6:
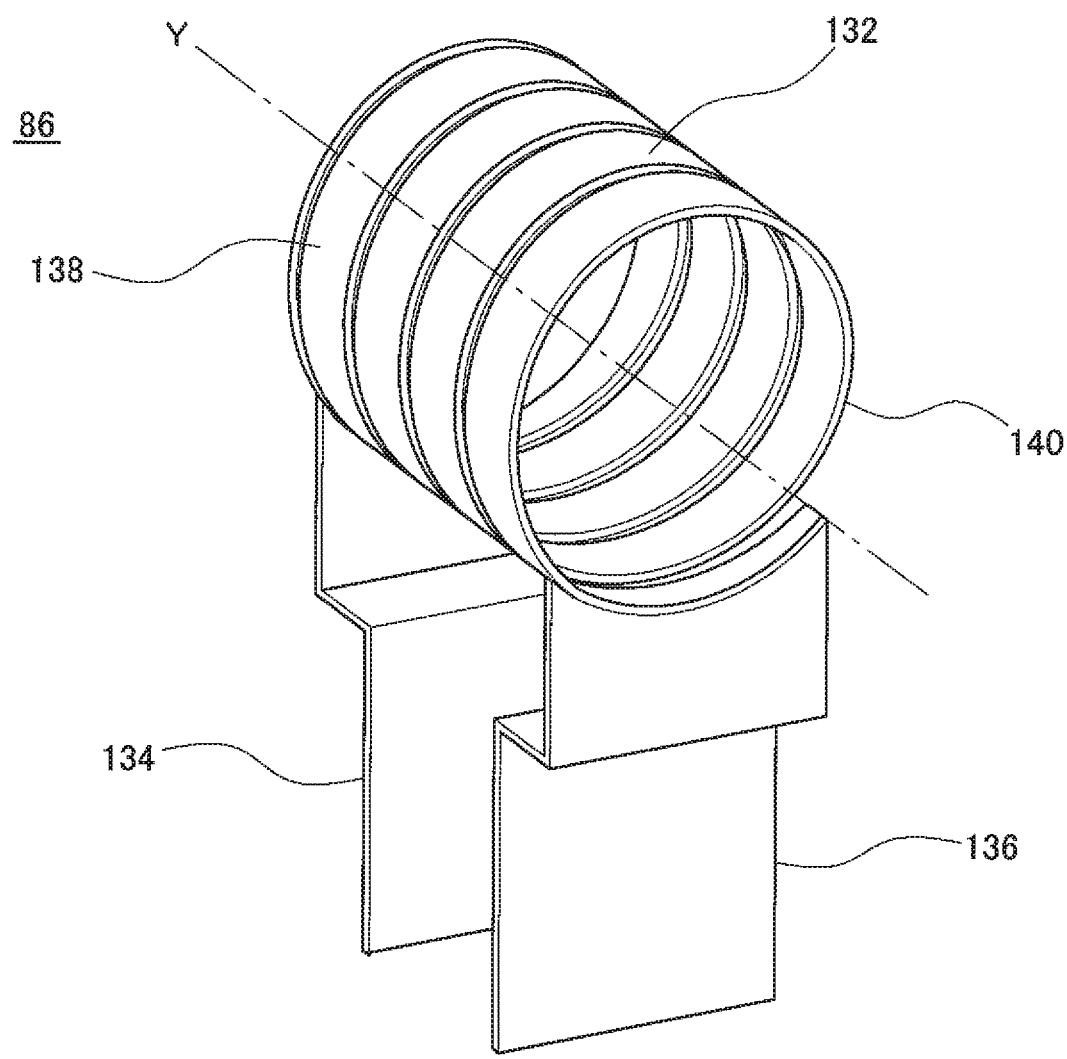
FIG. 6 is a perspective view illustrating an LF coil according to the first embodiment.

Hereinafter, the LF coil 86 will be described in detail with reference to FIG. 6. The LF coil 86 includes a solenoid body 132, a rear terminal 134, and a front terminal 136. A conductor having a ribbon-like (belt-like) shape constitutes the solenoid body 132. A material usable for the LF coil 86 is, for example, a conductor (e.g., high-purity oxygen-free copper) having a higher electric conductivity (low high-frequency resistance) at ordinary temperature and low temperature. The length of the LF coil 86 corresponds to the thickness of the coil mounting section 126 of the insulator block 124. The solenoid body 132 has a solenoidal shape. The number of turns of the solenoid body 132 is, for example, 3 to 5. The solenoid body 132 has a flatwise face 138 (a surface corresponding to a long side in the cross section of the solenoid body 132) and an edgewise face 140 (a surface corresponding to a short side in the cross section of the solenoid body 132). The solenoid body 132 is disposed on the inner surface of the through hole 130 in a state where the flatwise face 138 faces an inner circumferential surface of the through hole 130 of the coil mounting section 126. The solenoid body 132 has a central axis that coincides with the Y-axis. The rear terminal 134 is connected to one end of the solenoid body 132, and the front terminal 136 is connected to the other end of the solenoid body 132. The rear terminal 134 and the front terminal 136 extend from respective ends of the through hole 130 toward the protrusion 128 side and are terminated. The rear terminal 134 and the front terminal 136 are connected, via separate conductors, to the LF tuning variable capacitor 90, the LF balance variable capacitor 92, and the matching variable capacitor 94, as illustrated in FIG. 4, thereby forming a tank circuit. The tank circuit functions as an LC resonator having a resonance point in the vicinity of a resonance frequency corresponding to a low-frequency nuclide. The solenoid body 132 forms, at a sample center, a main magnetic field whose direction is parallel to the Y-axis.

Hereinafter, the HF primary resonator 88 will be described in detail with reference to FIG. 7. The HF primary resonator 88, when embedded in the coil mounting section 126 of the insulator block 124, is held by the coil mounting section 126 (the insulator block 124), and functions as an LC resonator having a resonance point in the vicinity of a resonance frequency corresponding to a high-frequency nuclide. The HF primary resonator 88 includes a Helmholtz coil part 142 and a capacitor part 144. A conductor having a ribbon-like (belt-like) shape constitutes the HF primary resonator 88. A material usable for the HF primary resonator 88 is, for example, a conductor (e.g., high-purity oxygen-free copper) having a higher electric conductivity (low high-frequency resistance) at ordinary temperature and low temperature. A pair of saddle coils (the saddle coils 106 and 108) constitutes the Helmholtz coil part 142. The saddle coils 106 and 108 are arranged to face each other on the X-axis. More specifically, as illustrated in FIG. 5, the saddle coils 106 and 108 are provided in the coil mounting section 126 in such a way as to sandwich the solenoid body 132 of the LF coil 86 in the X direction. Each of the saddle coils 106 and 108 has a flatwise face 146 and an edgewise face 148. The capacitor part 144 lies between the saddle coil 106 and the saddle coil 108. The saddle coil 106 is connected to one terminal of the capacitor part 144, and the saddle coil 108 is connected to the other terminal of the capacitor part 144. The capacitor part 144 functions as the capacitor 110 and the tuning variable capacitor 112 illustrated in FIG. 4. Further, as illustrated in FIG. 5, the capacitor part 144 is disposed on the Z-axis in the coil mounting section 126. A pair of counter electrodes constitutes the capacitor part 144. Each electrode, in a mounted state, does not cross the saddle coils 106 and 108.

Figure 8:
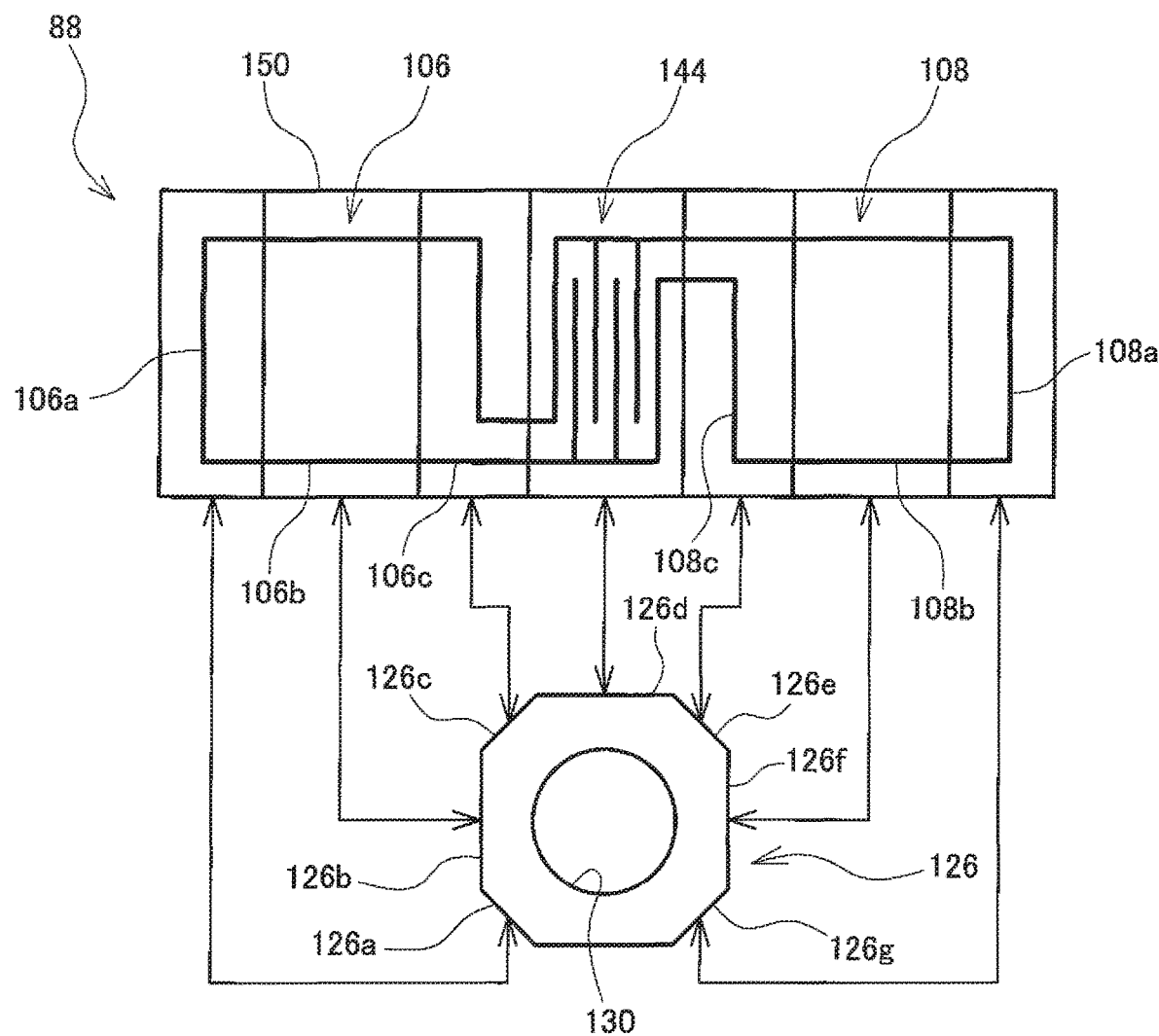
FIG. 8 illustrates a correspondence relationship between the HF primary resonator and an outer surface of a coil mounting section.

Hereinafter, a correspondence relationship between the HF primary resonator 88 and an outer surface of the coil mounting section 126 will be described in detail with reference to FIG. 8. FIG. 8 illustrates a developed state of the coil mounting section 126 and the HF primary resonator 88, seen from the Y direction.

For example, the coil mounting section 126 has a columnar shape whose cross section is octagonal. The saddle coil 106 includes a coil part 106*a* disposed at a position farthest from the capacitor part 144, a coil part 106*c* disposed at a position closest to the capacitor part 144, and a coil part 106*b* interposed between the coil part 106*a* and the coil part 106*c*. The coil part 106*a* is provided on a lower left face 126*a*, of the outer surface of the coil mounting section 126, in an embedded state (bite state). The coil part 106*b* is provided on a left face 126*b* of the outer surface in an embedded state (bite state). The coil part 106*c* is provided on an upper left face 126*c* of the outer surface in an embedded state (bite state). Similarly, the saddle coil 108 includes a coil part 108*a* disposed at a position farthest from the capacitor part 144, a coil part 108*c* disposed at a position closest to the capacitor part 144, and a coil part 108*b* interposed between the coil part 108*a* and the coil part 108. The coil part 108*a* is provided on a lower right face 126*g*, of the outer surface of the coil mounting section 126, in an embedded state (bite state). The coil part 108*b* is provided on a right face 126*f* of the outer surface in an embedded state (bite state). The coil part 108*c* is provided on an upper right face 126*e* of the outer surface in an embedded state (bite state). The saddle coils 106 and 108 have a three-dimensional shape, like a gable roof, and are a one-turn loop coil having an aperture angle of 90°. The saddle coils 106 and 108 are paired to be symmetric in rotation two times with respect to the Z-axis.

The illustrated shape of the coil mounting section 126 is a mere example. The coil mounting section 126 may be configured to have a circular shape, or any other rectangular shape, in cross section.

As illustrated in FIG. 8, the HF primary resonator 88 is a closed circuit as a whole, in which the saddle coils 106 and 108 are connected to each other in a unicursal state with their terminals not intersecting.

The capacitor part 144 is composed of a set of counter electrodes, which are connected to the saddle coils 106 and 108 respectively. The capacitor part 144 is provided on a top face 126*d*, of the outer surface of the coil mounting section 126, in an embedded state (bite state). The Z-axis penetrates the top face 126*d*. The counter electrodes of the capacitor part 144 are configured to protrude like comb teeth in a mutually nested manner, to enhance the capacitive coupling therebetween.

In the drawing, a line 150 is a virtual line, not a line indicating the configuration of the HF primary resonator 88.

In the vicinity of the resonant frequency corresponding to a high-frequency nuclide, the direction of a main magnetic field formed by the Helmholtz coil part 142 of the HF primary resonator 88, at a sample center, is parallel to the X direction. Using the Helmholtz coil part 142 is advantageous in that the magnetic field uniformity in the sample space can be kept high.

The outer surface of the conductor constituting the Helmholtz coil part 142 and the capacitor part 144 is coated with an insulator whose thickness is sufficiently greater than the wavelength of the high-frequency withstand voltage in vacuum, and is insulated from the vacuum space in the NMR probe 54.

An exemplary method for manufacturing the HF primary resonator 88 will be described in detail below. The manufacturing method includes forming a groove having the shape of the HF primary resonator 88 on the outer surface of the coil mounting section 126 of the insulator block 124 by laser processing. The manufacturing method further includes applying copper plating to the outer surface of the coil mounting section 126 to fill the groove with copper. The manufacturing method further includes peeling the copper off the surface other than the groove by etching or the like. The manufacturing method further includes coating the outer surface entirely with an insulating material, such as alumina powder, by an aerosol deposition method or the like. The manufacturing method described above can completely insulate the HF primary resonator 88 from the vacuum space, because the insulator covers the entire surface of the HF primary resonator 88. The thickness of a coating film is, for example, several tens of μm. For example, a conventional manufacturing method discussed in JP 2014-41103 A can be employed to manufacture the LF coil 86. For example, entirely plating the inner surface of the through hole 130 formed in the coil mounting section 126 can form a conductor film. Subsequently, patterning the conductor film followed by etching treatment can complete the LF coil 86.

Figure 9:
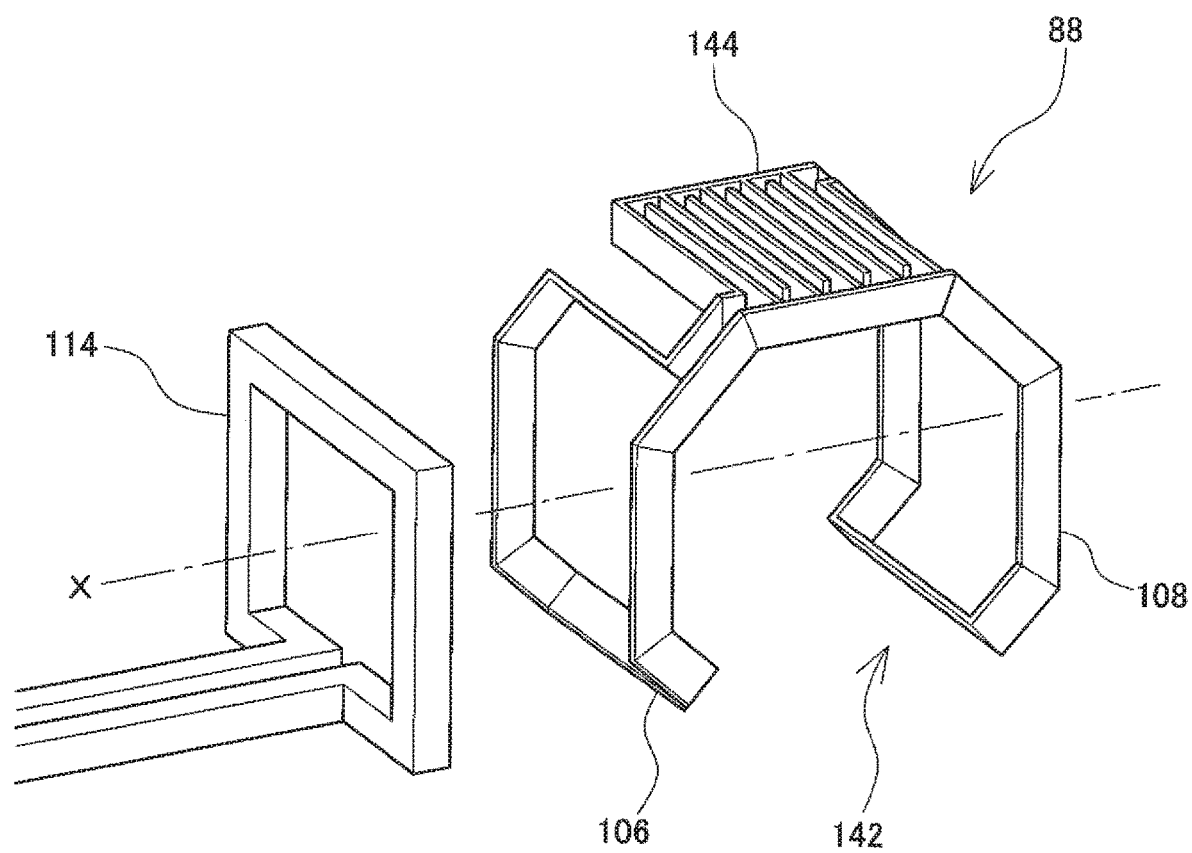
FIG. 9 is a perspective view illustrating the HF primary resonator and an HF secondary coil.

Hereinafter, a positional relationship between the HF primary resonator 88 and the HF secondary coil 114 (see FIG. 4) will be described in detail with reference to FIG. 9. As described with reference to FIG. 4, the HF primary resonator 88 is disposed in the vacuum container 66 and the HF secondary coil 114 is disposed outside the vacuum container 66. More specifically, the HF primary resonator 88 is disposed in the thermally insulated vacuum space 84, while the HF secondary coil 114 and the HF transmission line 116 are disposed in an atmospheric space. Mutual inductive coupling between the HF primary resonator 88 and the HF secondary coil 114 realizes power supply from the outside to the HF primary resonator 88.

The HF secondary coil 114 is movably disposed at a position adjacent to the Helmholtz coil part 142, with an intervening partition wall of the vacuum container 66 (an insulator of low dielectric loss, such as, sapphire, or alumina, or the like). According to the example illustrated in FIG. 9, the HF secondary coil 114 is disposed at a position facing the saddle coil 106. The HF secondary coil 114 is a loop coil made of a conductor. As illustrated in FIG. 4, an end of the HF secondary coil 114 is connected to the HF transmitting/receiving port 118 via the HF transmission line 116. The HF secondary coil 114 forms a main magnetic field that is parallel to the X direction. The HF secondary coil 114, in a mounted state, maximizes the inductive coupling between the HF secondary coil 114 and the Helmholtz coil part 142. The HF secondary coil 114 may be held by, for example, an insulator or may be an air-core coil that is not held by an insulator.

Changing the distance between the HF secondary coil 114 and the Helmholtz coil part 142 can control impedance matching for supplying electric power to the HF primary resonator 88. The HF secondary coil 114 can be moved manually or automatically. Bringing the HF secondary coil 114 close to or far from the Helmholtz coil part 142 (the saddle coil 106) can control the impedance matching for supplying electric power to the HF primary resonator 88. Changing the distance between the HF secondary coil 114 and the Helmholtz coil part 142 according to a sample (e.g., a measurement target nuclide or the like) can optimize the impedance matching for each sample.

Hereinafter, a positional relationship between the LF coil 86 and the HF primary resonator 88 will be described in detail with reference to FIGS. 5 to 7. As mentioned above, the LF coil 86 is a coil for detecting an NMR signal from a low-frequency nuclide and is disposed at a position adjacent to the sample tube 58 inserted in the through hole 130 formed in the insulator block 124. On the other hand, the HF primary resonator 88 is disposed in such a way as to surround the LF coil 86 to irradiate a high-frequency nuclide with a magnetic field in observing the NMR signal from the low-frequency nuclide.

The LF coil 86 and the HF primary resonator 88 are arranged in such a manner that a main magnetic field formed by the LF coil 86 becomes orthogonal to a main magnetic field formed by the HF primary resonator 88, in order to further decrease (for example, minimize) the mutual inductance. More specifically, the main magnetic field formed by the LF coil 86 is parallel to the Y direction, and the main magnetic field formed by the HF primary resonator 88 is parallel to the Z direction. These magnetic fields are orthogonal to each other.

Figure 7:
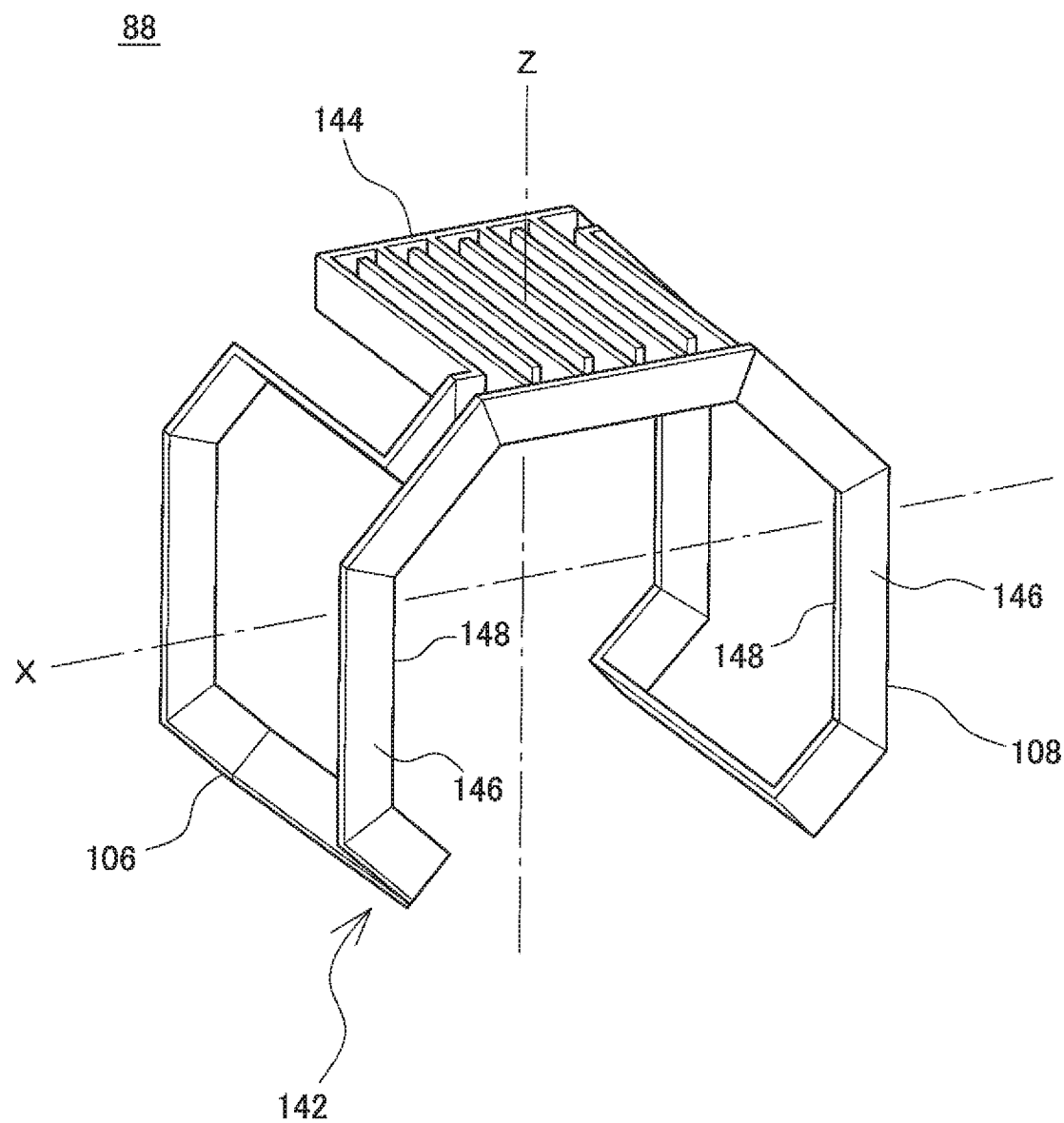
FIG. 7 is a perspective view illustrating an HF primary resonator according to the first embodiment.

Further, as illustrated in FIGS. 5 and 7, the saddle coils 106 and 108 included in the HF primary resonator 88 are arranged in such a manner that the edgewise face 148 faces the inner circumferential surface of the through hole 130 from the outside of the coil mounting section 126. On the other hand, the solenoid body 132 of the LF coil 86 is arranged in such a manner that the flatwise face 138 faces the inner circumferential surface of the through hole 130. In other words, the saddle coils 106 and 108 and the solenoid body 132 are arranged in such a manner that the edgewise face 148 of the saddle coils 106 and 108 and the flatwise face 138 of the solenoid body 132 face each other. The above-mentioned arrangement is advantageous in that the area of mutually confronting portions becomes smaller, as compared to a case where the flatwise face 146 of the saddle coils 106 and 108 and the flatwise face 138 of the solenoid body 132 face each other, and therefore can reduce (for example, minimize) the capacitive coupling generating between the HF primary resonator 88 and the LF coil 86.

Employing the above-mentioned configuration can suppress high-frequency coherence between the HF side circuit and the LF side circuit and can enhance isolation (solitary state) of both circuits without providing any auxiliary circuit, such as a filter or a trap. As a result, RF magnetic field irradiation efficiency and NMR signal detection efficiency can be enhanced for each of HF and LF. In addition, when a high-frequency nuclide is irradiated with the RF magnetic field, the current flowing into an LF side auxiliary circuit can be reduced. Therefore, considerably reducing the gradient in electric field induced there is feasible and the occurrence of electric discharge in the vacuum can be prevented. For example, according to numerical calculation results obtained from a relative placement model according to the first embodiment based on the finite element method, transmission characteristics from the HF circuit to the LF circuit at the frequency of high-frequency nuclide irradiation is approximately −30 dB. Therefore, the high-frequency RF power in an NMR probe inner space below the mounting position of the cryogenic cross-coil can be reduced to $\frac{1}{1000}$. Since its value is sufficiently lower than the occurrence limit of creeping discharge and multipactor discharge in higher vacuum, preventing the discharge is feasible.

Figure 10:
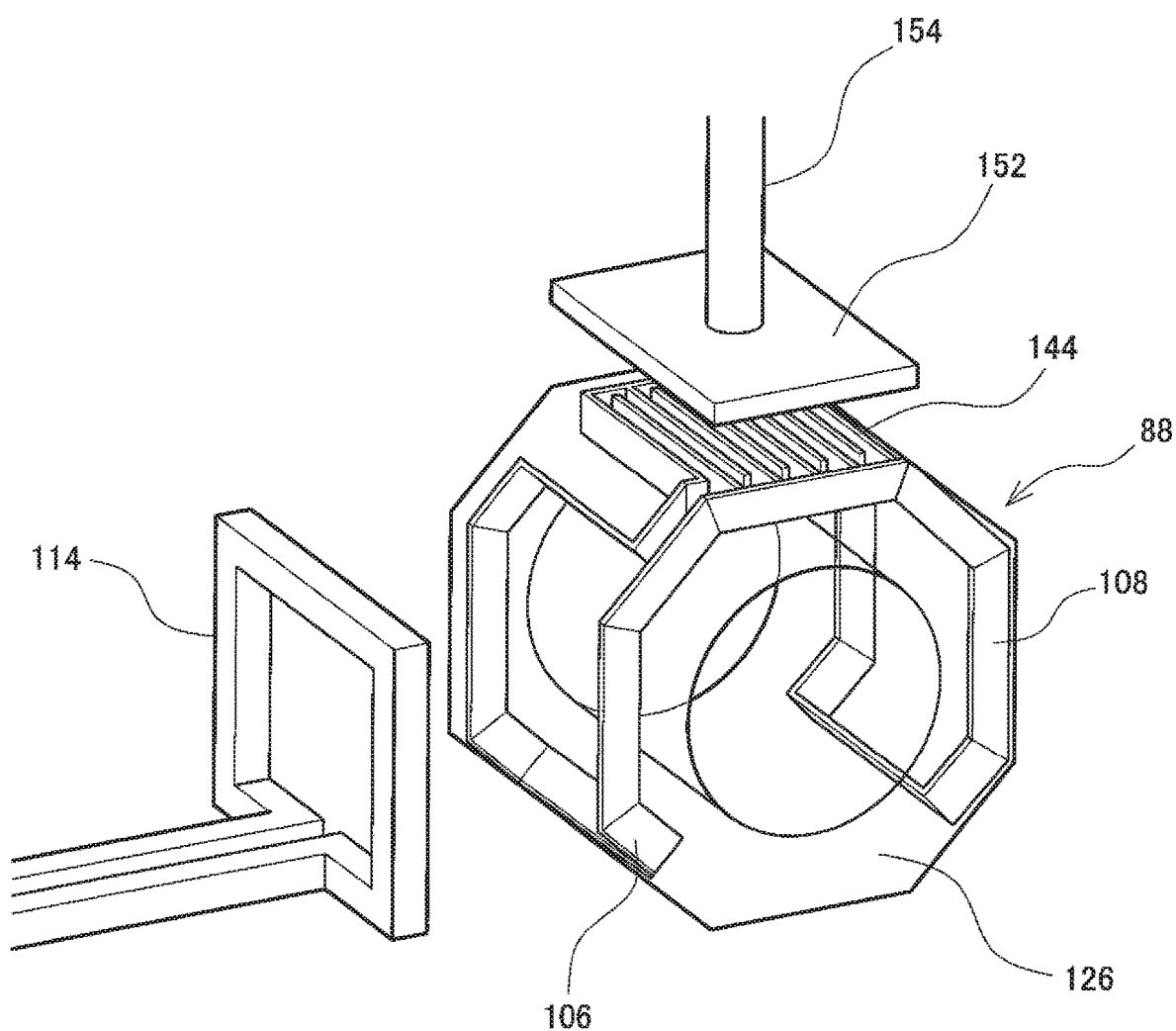
FIG. 10 is a perspective view illustrating the HF primary resonator and a dielectric plate.

Hereinafter, exemplary tuning of the HF primary resonator 88 will be described in detail with reference to FIG. 10. Changing a capacity component installed in parallel with the capacitor part 144 included in the HF primary resonator 88 can tune the resonant frequency of the HF primary resonator 88. Using a dielectric plate 152 can realize the above-mentioned tuning mechanically. The dielectric plate 152 is, for example, $SrTiO_3$ or the like. The dielectric plate 152 is disposed in the vacuum container 66 (namely, in the thermally insulated vacuum space 8). More specifically, the dielectric plate 152 is positioned so as to face the capacitor part 144; namely, the top face 126*d* (see FIG. 8) of the coil mounting section 126. The dielectric plate 152 is connected to a position adjusting mechanism 154. The position adjusting mechanism 154 is capable of moving the dielectric plate 152 air-tightly from the outside of the vacuum container 66, so as to change the distance between the dielectric plate 152 and the capacitor part 144. Changing the distance as mentioned above can change a stray capacitance of the capacitor part 144 to adjust the resonant frequency finely. Although the dielectric plate 152 is disposed in a room temperature environment, the dielectric plate 152 is not a conductor, and no thermal noise radiation occurs. Therefore, the dielectric plate 152 can adjust the tuning of the resonant frequency of the HF primary resonator 88 with respect to a high-frequency nuclide, without deteriorating the NMR signal detection sensitivity of the HF primary resonator 88 or the LF coil 86.

Figure 11:
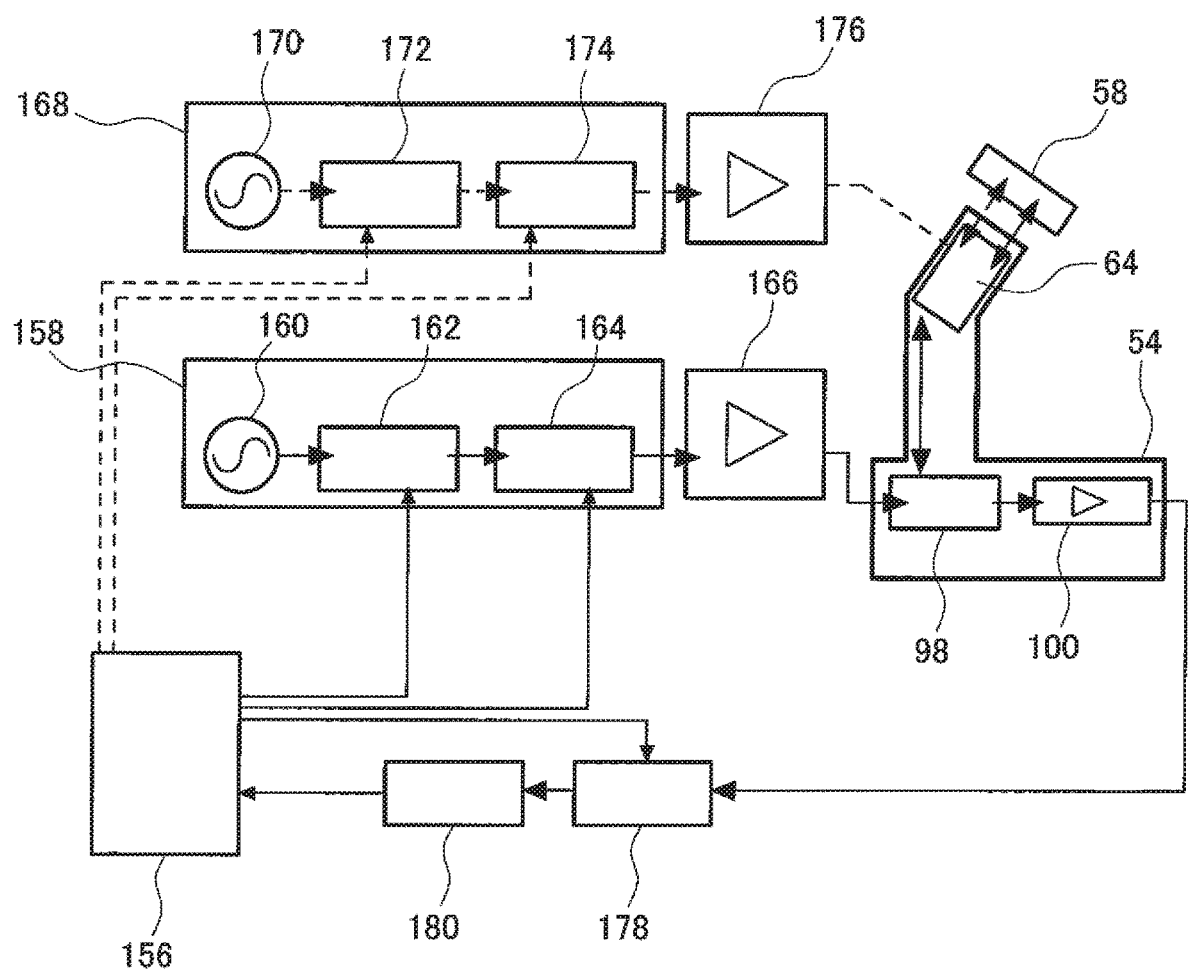
FIG. 11 illustrates a configuration example of the NMR spectrometer system according to the first embodiment.

Hereinafter, the NMR spectrometer system according to the first embodiment will be described in detail with reference to FIG. 11. In the first embodiment, a transmitter of the spectrometer transmits a high-frequency pulse to the NMR probe 54 equipped with the detection module 64. While high-frequency irradiation for HF (high-frequency nuclide) is performed, the NMR spectrometer system acquires an NMR signal of LF (low-frequency nuclide).

In general, when a solid high-resolution NMR spectrum of a low-frequency nuclide ($^{13}C$ nucleus, $^{15}N$ nucleus, or the like) is acquired in a solid organic substance, in order to reduce the influence of a high-frequency nuclide ($^1$H nucleus or the like) widening the resonance line of the $^{13}$C nucleus through internal interaction (e.g., dipole interaction of $^1$H-$^{13}$C), a decoupling method for the $^1$H nucleus (an operation for reducing the influence of internal interaction derived from $^1$H nucleus by imparting perturbation in the HF high-output oscillating field during the time of observing $^{13}$C nucleus) is applied. The decoupling method to be applied in this case requires an NMR spectrometer system capable of synchronously performing high-frequency magnetic field irradiation for both of the $^{13}$C nucleus and the $^1$H nucleus and an NMR probe for double resonance. For example, in order to improve the sensitivity of a solid high-resolution NMR spectrum of the $^{13}$C nucleus, the NMR probe employed in the first embodiment is the NMR probe 54 equipped with the detection module 64 including a cryogenic cross-coil.

If necessary (for example, depending on the application of the decoupling method or the like), a user who performs measurement may cause a control computer 156 to program a time-series sequence with respect to transmission of LF high-frequency oscillation signal, transmission of an HF high-frequency oscillation signal, and reception of an LF high-frequency observation signal.

First, in an LF transmitter 158, an LF high-frequency oscillator 160 generates an LF high-frequency oscillation signal. The control computer 156, according to the program, causes an LF phase controller 162 and an LF amplitude controller 164 to control the phase and the amplitude of the LF high-frequency oscillation signal to send it to an LF power amplifier 166. The LF power amplifier 166 amplifies the LF high-frequency oscillation signal so that the electric power becomes sufficient to excite an LF nucleus. The amplified LF high-frequency oscillation signal is supplied, via the duplexer 98 in the NMR probe 54, to the LF coil 86 in the detection module 64. The LF coil 86 irradiates the sample tube 58 and a sample therein with the magnetic field at room temperature and under atmospheric pressure. After the LF high-frequency irradiation, a relatively small NMR signal of the LF nucleus is output from the sample. The LF coil 86 detects the NMR signal of the LF nucleus, and subsequently sends the detected signal to the preamplifier 100 via the duplexer 98. The preamplifier 100 amplifies the NMR signal so as to have receivable signal intensity, and sends the amplified signal as an LF high-frequency reception signal to an LF receiver 178.

While the LF high-frequency irradiation and the LF nucleus NMR signal detection are performed as mentioned above, an HF high-frequency oscillator 170 in an HF transmitter 168 generates an HF high-frequency oscillation signal. The control computer 156, according to the program, causes an HF phase controller 172 and an HF amplitude controller 174 to control the phase and the amplitude of the HF high-frequency oscillation signal to send it to an HF power amplifier 176. The HF power amplifier 176 amplifies the HF high-frequency oscillation signal so that the electric power becomes sufficient to excite the HF nucleus. The amplified HF high-frequency oscillation signal is supplied, via the HF secondary coil 114 illustrated in FIG. 9, to the Helmholtz coil part 142 of the HF primary resonator 88. The Helmholtz coil part 142 irradiates the sample tube 58 and the sample therein with the magnetic field.

The LF receiver 178 performs wave detection processing and frequency conversion processing on the LF high-frequency reception signal amplified by the preamplifier 100, so as to convert the LF high-frequency reception signal into a reception signal of audio frequency band. An A/D converter 180 converts the reception signal into a digital signal, and sends the digital reception signal to the control computer 156. The control computer 156 has a function of performing FFT processing (i.e., processing for converting an NMR signal on the time axis into a spectrum signal on the frequency axis). A display device displays a spectrum on its screen based on the spectrum signal having been subjected to the predetermined processing.

As mentioned above, it is feasible to acquire the NMR signal of the LF nucleus as measurement data while irradiating the sample with the HF high-frequency magnetic field.

According to the first embodiment, the HF primary resonator 88 is embedded in the insulator block 124, and the HF primary resonator 88 is not exposed. Such an arrangement can weaken high-frequency coherence between the HF primary resonator 88 and the LF coil 86. As a result, it becomes feasible to irradiate the sample with the high-frequency magnetic field without causing creeping discharge or multipactor discharge.

For example, according to numerical calculation results obtained from the first embodiment based on the finite element method, when the resonant frequency is 400 MHz and the input power is 100 W in the high-frequency irradiation performed, the gradient in electric field is maximized in the HF primary resonator 88 at a portion adjacent to the capacitor part 144, and its value (calculation result) is approximately 4 kV/mm. The dielectric breakdown strength of sapphire is approximately 43 kV/mm, and the dielectric breakdown strength of an alumina coating film having a thickness of 30 μm by the aerosol deposition method is 300 kV/mm. Therefore, they both have a withstand voltage ten times or more greater.

In addition, since the LF coil 86 and the HF primary resonator 88 can be disposed in the same temperature environment, the detection sensitivity of the NMR signal improves.

Further, since the circuit configuration of the LF coil 86 can be incorporated in a balance circuit (maximizing the detection efficiency by equalizing electric capacity between the two ends of the LF coil 86 and a ground plane), the detection sensitivity of the NMR signal improves.

Second Embodiment

Figure 12:
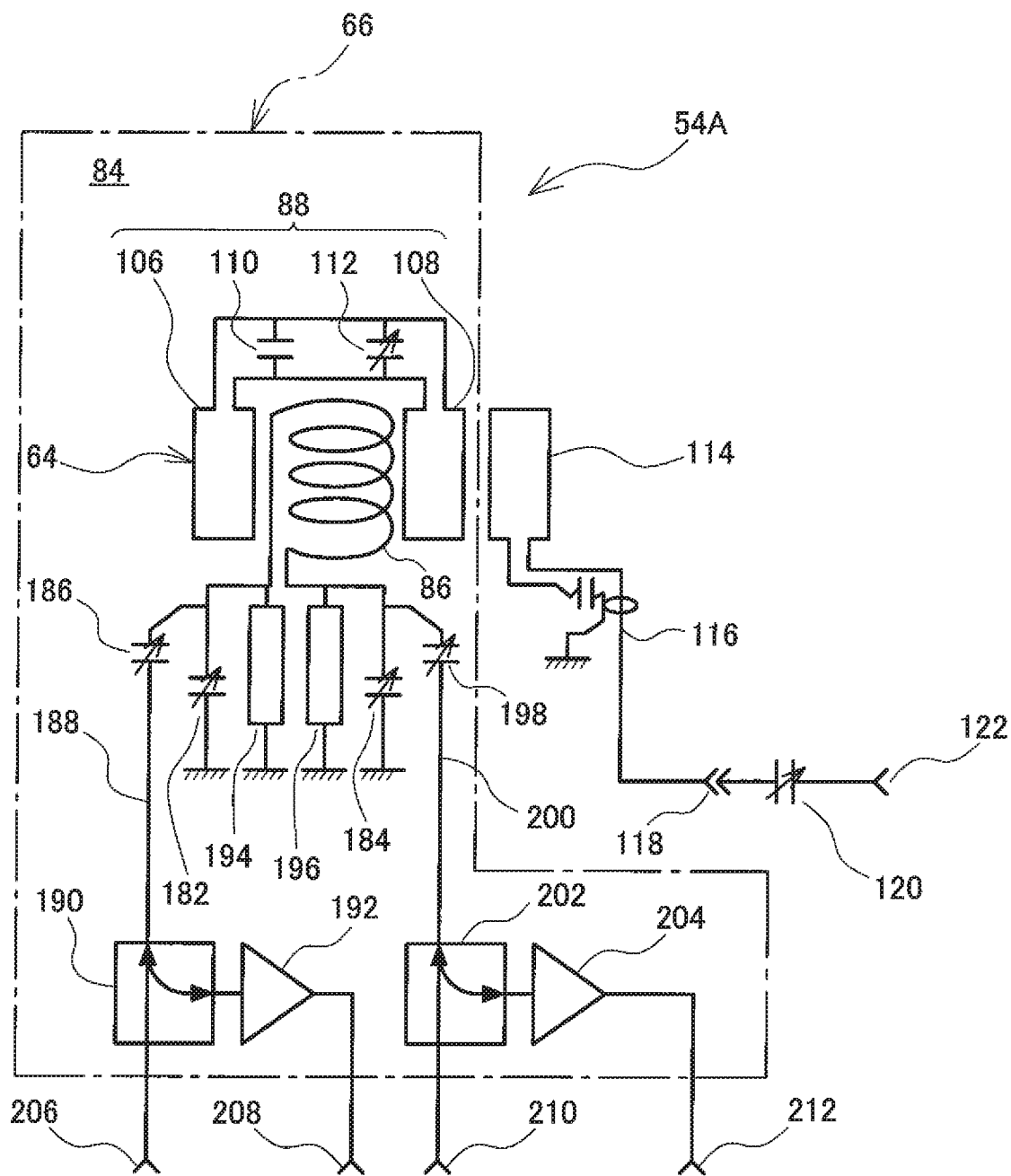
FIG. 12 illustrates a circuit configuration of a detection system cooling NMR probe according to a second embodiment.

Hereinafter, a circuit configuration of an NMR probe 54A according to a second embodiment will be described in detail with reference to FIG. 12. The NMR probe 54A according to the second embodiment is similar to the NMR probe 54 according to the first embodiment, in that an LF coil 86 serving as a low-frequency nuclide coil and an HF primary resonator 88 serving as a high-frequency nuclide coil cooperatively constitute a cryogenic cross-coil. In the second embodiment, while performing high-frequency irradiation for HF (high-frequency nuclide), the NMR probe 54A acquires an NMR signal of LF1 (low-frequency nuclide) and an NMR signal of LF2 (low-frequency nuclide). The frequency of LF1 is higher than the frequency of LF2. Constituent components similar to those described in the first embodiment are denoted by the same reference numerals.

A vacuum container 66 includes a thermally insulated vacuum space 84, in which the LF coil 86, the HF primary resonator 88, an LF1 tuning variable capacitor 182, an LF2 tuning variable capacitor 184, an LF1 matching variable capacitor 186, an LF1 transmission line (coaxial cable for extremely low-temperature) 188, an LF1 duplexer 190, an LF1 preamplifier 192, nodes 194 and 196, an LF2 matching variable capacitor 198, an LF2 transmission line (coaxial cable for extremely low-temperature) 200, an LF2 duplexer 202, and an LF2 preamplifier 204 are provided. These constituent components can be cooled in the vacuum container 66 so that the detection sensitivity of the NMR signal can be improved.

The LF1 tuning variable capacitor 182 and the node 194 are connected to one end of the LF coil 86. The LF coil 86 is grounded via the LF1 tuning variable capacitor 182 and is also grounded via the node 194. Such an arrangement is for performing the tuning. The node 194 can function as a band-pass filter through which the frequency of LF1 can pass. In addition, the one end of the LF coil 86 is also connected to the LF1 matching variable capacitor 186, as a configuration for performing the matching. The one end of the LF coil 86 is connected, via the LF1 matching variable capacitor 186, to the LF1 transmission line 188 and is further connected, via the LF1 transmission line 188, to the LF1 duplexer 190 and the LF1 preamplifier 192. These constituent components can be cooled in the thermally insulated vacuum space 84. Lowering the temperature of a conductor portion of the LF coil 86 to an extremely low-temperature can improve the detection sensitivity of an NMR signal of low-frequency nuclide (LF1). In addition, an LF1 transmitting port 206 is connected to the LF1 duplexer 190, and an LF1 receiving port 208 is connected to the LF1 preamplifier 192. The LF1 duplexer 190, when operating in a transmission mode, sends to the LF coil 86 a transmission signal received from the spectrometer via the LF1 transmitting port 206. The LF1 duplexer 190, when operating in a reception mode, sends to the LF1 preamplifier 192 an NMR signal of LF1 detected by the LF coil 86. The LF1 preamplifier 192 amplifies the NMR signal and sends the amplified NMR signal, via the LF1 receiving port 208, to the spectrometer.

The LF2 tuning variable capacitor 184 and the node 196 are connected to the other end of the LF coil 86. The LF coil 86 is grounded via the LF2 tuning variable capacitor 184 and is also grounded via the node 196. Such an arrangement is for performing the tuning. The node 196 functions as a band eliminate filter capable of attenuating the frequency of, for example, LF1 to a very low level. In addition, the other end of the LF coil 86 is connected to the LF2 matching variable capacitor 198, as a configuration for performing the matching. The other end of the LF coil 86 is connected, via the LF2 matching variable capacitor 198, to the LF2 transmission line 200 and is further connected, via the LF2 transmission line 200, to the LF2 duplexer 202 and the LF2 preamplifier 204. These constituent components can be cooled in the thermally insulated vacuum space 84. Lowering the temperature of the conductor portion of the LF coil 86 to an extremely low temperature can improve the detection sensitivity of an NMR signal of low-frequency nuclide (LF2). In addition, an LF2 transmitting port 210 is connected to the LF2 duplexer 202, and an LF2 receiving port 212 is connected to the LF2 preamplifier 204. The LF2 duplexer 202, when operating in a transmission mode, sends to the LF coil 86 a transmission signal received from the spectrometer via the LF2 transmitting port 210. The LF2 duplexer 202, when operating in a reception mode, sends to the LF2 preamplifier 204 an NMR signal of LF2 detected by the LF coil 86. The LF2 preamplifier 204 amplifies the NMR signal and sends the amplified NMR signal, via the LF2 receiving port 212, to the spectrometer.

Figure 13:
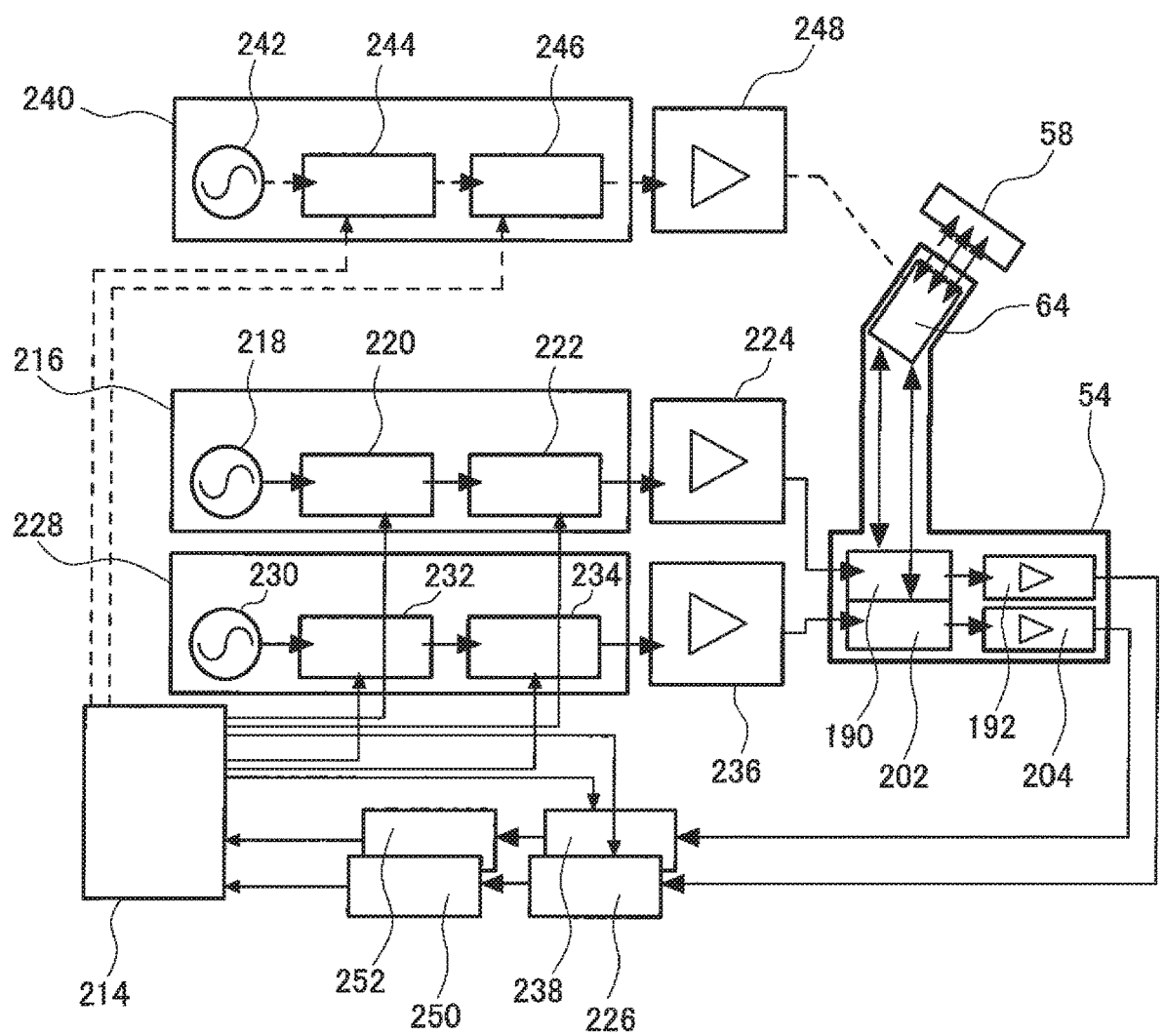
FIG. 13 illustrates a configuration example of the NMR spectrometer system according to the second embodiment.

Hereinafter, an NMR spectrometer system according to the second embodiment will be described in detail with reference to FIG. 13. In the second embodiment, a transmitter of the spectrometer transmits a high-frequency pulse to the NMR probe 54A equipped with a detection module 64. While performing high-frequency irradiation for HF (high-frequency nuclide), the NMR spectrometer system acquires an NMR signal of LF1 (low-frequency nuclide) and an NMR signal of LF2 (low-frequency nuclide).

In general, when a solid high-resolution NMR spectrum of an LF1 nucleus (e.g., $^{13}$C or the like) and an LF2 nucleus (e.g., $^{15}$N or the like) is acquired in a solid organic substance, in order to reduce the influence of a high-frequency nuclide ($^1$H nucleus or the like) widening the resonance line of the LF1 nucleus and the LF2 nucleus through internal interaction (e.g., dipole interaction of $^1$H-$^{13}$C and dipole interaction of $^1$H-$^{15}$N), a decoupling method for the $^1$H nucleus is applied. The decoupling method to be applied requires an NMR spectrometer system capable of synchronously performing high-frequency magnetic field irradiation for all of the HF nucleus, the LF1 nucleus, and the LF2 nucleus and an NMR probe for triple resonance. For example, in order to improve the sensitivity of solid high-resolution NMR spectrums of the LF1 nucleus and the LF2 nucleus, the NMR probe employed in the second embodiment is the NMR probe 54A equipped with the detection module 64 including a cryogenic cross-coil.

If necessary (for example, depending on the application of the decoupling method or the like), a user who performs measurement may cause a control computer 214 to program a time-series sequence with respect to transmission of an LF1 high-frequency oscillation signal, transmission of an LF2 high-frequency oscillation signal, transmission of an HF high-frequency oscillation signal, reception of an LF1 high-frequency observation signal, and reception of an LF2 high-frequency observation signal.

First, in an LF1 transmitter 216, an LF1 high-frequency oscillator 218 generates an LF1 high-frequency oscillation signal. The control computer 214, according to the program, causes an LF1 phase controller 220 and an LF1 amplitude controller 222 to control the phase and the amplitude of the LF1 high-frequency oscillation signal to send it to an LF1 power amplifier 224. The LF1 power amplifier 224 amplifies the LF1 high-frequency oscillation signal so that the electric power becomes sufficient to excite the LF1 nucleus. The amplified LF1 high-frequency oscillation signal is supplied, via the LF1 duplexer 190 in the NMR probe 54, to the LF coil 86 in the detection module 64. The LF coil 86 irradiates a sample tube 58 and a sample therein with the magnetic field at room temperature under atmospheric pressure. After the LF1 high-frequency irradiation, a relatively small NMR signal of the LF1 nucleus is output from the sample. The LF coil 86 detects the NMR signal of the LF1 nucleus, and subsequently sends the detected signal to the LF1 preamplifier 192 via the LF1 duplexer 190. The LF1 preamplifier 192 amplifies the NMR signal so as to have receivable signal intensity, and sends the amplified signal as an LF1 high-frequency reception signal to an LF1 receiver 226.

Similarly, in an LF2 transmitter 228, an LF2 high-frequency oscillator 230 generates an LF2 high-frequency oscillation signal. The control computer 214, according to the program, causes an LF2 phase controller 232 and an LF2 amplitude controller 234 to control the phase and the amplitude of the LF2 high-frequency oscillation signal to send it to an LF2 power amplifier 236. The LF2 power amplifier 236 amplifies the LF2 high-frequency oscillation signal so that the electric power becomes sufficient to excite the LF2 nucleus. The amplified LF2 high-frequency oscillation signal is supplied, via the LF2 duplexer 202 in the NMR probe 54A, to the LF coil 86 in the detection module 64. The LF coil 86 irradiates the sample tube 58 and a sample therein with the magnetic field at room temperature and under atmospheric pressure. After the LF2 high-frequency irradiation, a relatively small NMR signal of the LF2 nucleus is output from the sample. The LF coil 86 detects the NMR signal of the LF2 nucleus, and subsequently sends the detected signal to the LF2 preamplifier 204 via the LF2 duplexer 202. The LF2 preamplifier 204 amplifies the NMR signal so as to have receivable signal intensity, and sends the amplified signal as an LF2 high-frequency reception signal to an LF2 receiver 238.

While the LF high-frequency irradiation and the LF nucleus NMR signal detection are performed as mentioned above, an HF high-frequency oscillator 242 in an HF transmitter 240 generates an HF high-frequency oscillation signal. The control computer 214, according to the program, causes an HF phase controller 244 and an HF amplitude controller 246 to control the phase and the amplitude of the HF high-frequency oscillation signal to send it to an HF power amplifier 248. The HF power amplifier 248 amplifies the HF high-frequency oscillation signal so that the electric power becomes sufficient to excite the HF nucleus. The amplified HF high-frequency oscillation signal is supplied, via the HF secondary coil 114 illustrated in FIG. 9, to the Helmholtz coil part 142 of the HF primary resonator 88. The Helmholtz coil part 142 irradiates the sample tube 58 and a sample therein with the magnetic field.

The LF1 receiver 226 performs wave detection processing and frequency conversion processing on the LF1 high-frequency reception signal amplified by the LF1 preamplifier 192, so as to convert the LF1 high-frequency reception signal into a reception signal of audio frequency band. An A/D converter 250 converts the reception signal into a digital signal, and sends the digital reception signal to the control computer 214.

Similarly, the LF2 receiver 238 performs wave detection processing and frequency conversion processing on the LF2 high-frequency reception signal amplified by the LF2 preamplifier 204, so as to convert the LF2 high-frequency reception signal into a reception signal of audio frequency band. An A/D converter 252 converts the reception signal into a digital signal, and sends the digital reception signal to the control computer 214.

The control computer 214 has a function of performing FFT processing (i.e., processing for converting an NMR signal on the time axis into a spectrum signal on the frequency axis). A display device displays a spectrum on its screen based on the spectrum signal having been subjected to the predetermined processing.

As mentioned above, it is feasible to acquire the NMR signal of the LF1 nucleus and the NMR signal of the LF2 nucleus as measurement data while irradiating the sample with the HF high-frequency magnetic field. The acquisition of the NMR signal from the LF nucleus may be acquiring only the NMR signal of the LF1 nucleus or only the NMR signal of the LF2 nucleus, or both of them.

Third Embodiment

Figure 14:
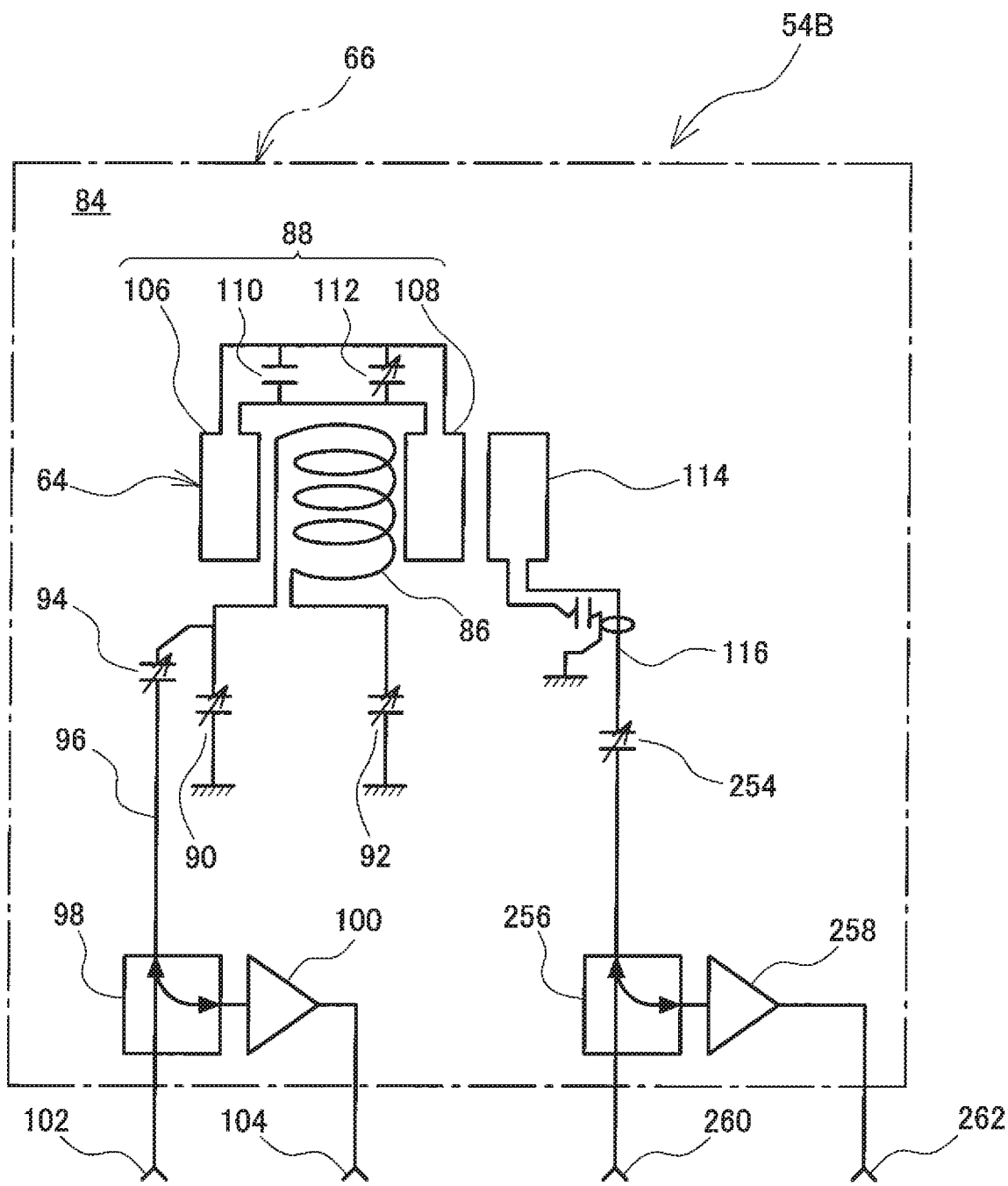
FIG. 14 illustrates a circuit configuration of a detection system cooling NMR probe according to a third embodiment.

Hereinafter, a circuit configuration of an NMR probe 54B according to a third embodiment will be described in detail with reference to FIG. 14. The NMR probe 54B according to the third embodiment is similar to the NMR probe 54 according to the first embodiment in that an LF coil 86 serving as a low-frequency nuclide coil and an HF primary resonator 88 serving as a high-frequency nuclide coil cooperatively constitute a cryogenic cross-coil. The NMR probe 54B according to the third embodiment includes a configuration for acquiring an NMR signal of LF (low-frequency nuclide) and a configuration for acquiring an NMR signal of HF (high-frequency nuclide). Constituent components similar to those described in the first embodiment are denoted by the same reference numerals.

The NMR probe 54B according to the third embodiment includes an HF secondary coil 114, an HF transmission line 116, an HF matching variable capacitor 254, an HF duplexer 256, and an HF preamplifier 258 provided in a thermally insulated vacuum space 84. The HF primary resonator 88 is wirelessly coupled with the HF secondary coil 114. The HF secondary coil 114 is connected, via the HF transmission line 116, to the HF matching variable capacitor 254 and is further connected to the HF duplexer 256 and the HF preamplifier 258. These constituent components can be cooled in the thermally insulated vacuum space 84. The HF secondary coil 114 is coated with an insulator, such as alumina powder. The thickness of the coating is, for example, several tens of μm. Such an arrangement can insulate the HF secondary coil 114 from the vacuum space. In addition, an HF transmitting port 260 is connected to the HF duplexer 256, and an HF receiving port 262 is connected to the HF preamplifier 258. The HF duplexer 256, when operating in a transmission mode, sends to the HF secondary coil 114 a transmission signal received from the spectrometer via the HF transmitting port 260. Then, the transmission signal is sent, via the HF secondary coil 114, to the HF primary resonator 88. The HF primary resonator 88 irradiates a sample tube 58 and a sample therein with the HF high-frequency magnetic field. The HF primary resonator 88 detects an NMR signal and sends it to the HF secondary coil 114. The HF duplexer 256, when operating in a reception mode, sends to the HF preamplifier 258 the NMR signal detected by the HF primary resonator 88 and sent to the HF secondary coil 114. The HF preamplifier 258 amplifies the NMR signal and sends the amplified NMR signal, via the HF receiving port 262, to the spectrometer.

The operation for LF is similar to that of the NMR probe 54 according to the first embodiment.

Figure 15:
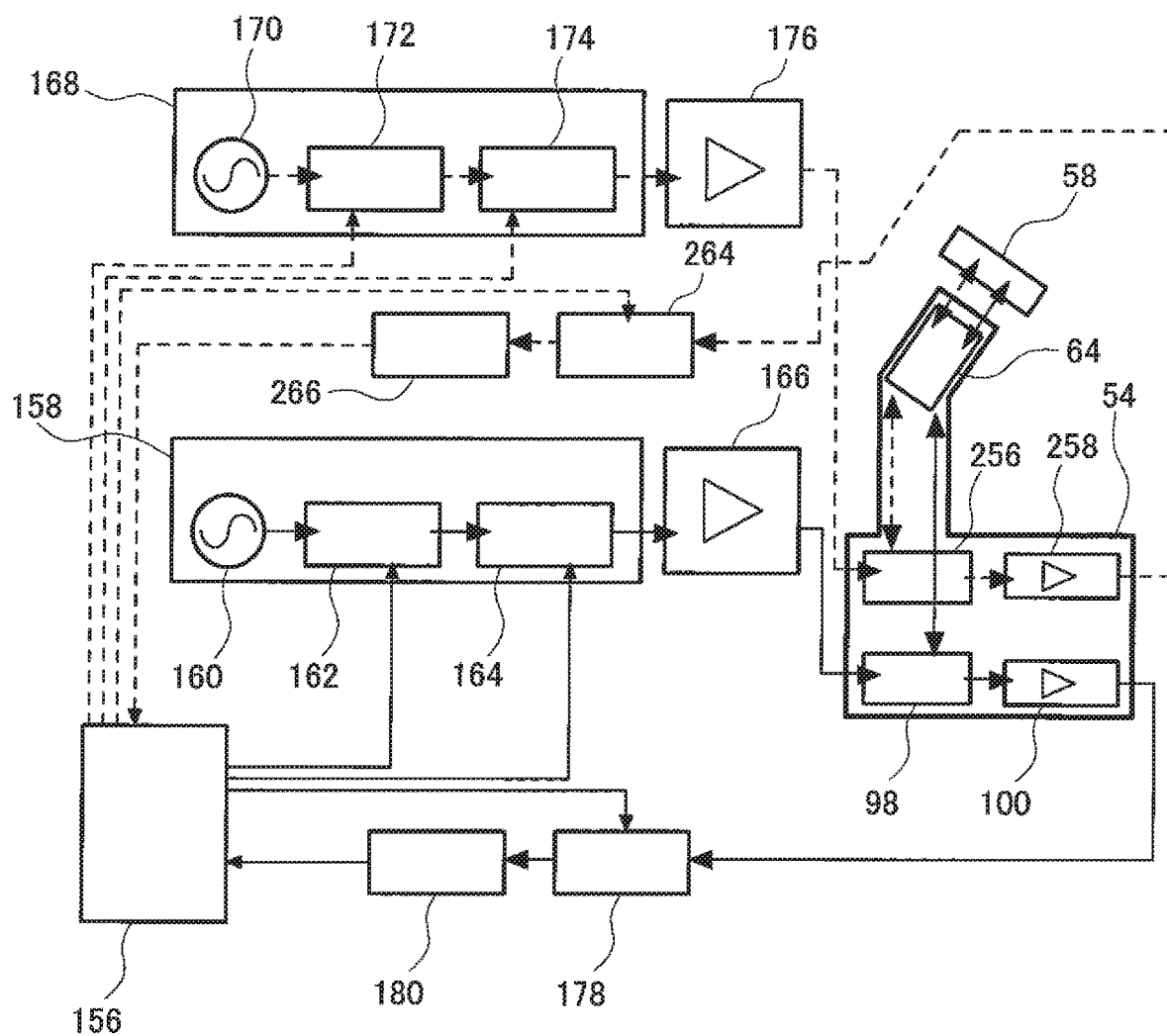
FIG. 15 illustrates a configuration example of an NMR spectrometer system according to the third embodiment.

Hereinafter, an NMR spectrometer system according to the third embodiment will be described in detail with reference to FIG. 15. In the third embodiment, a transmitter of the spectrometer transmits a high-frequency pulse to the NMR probe 54B equipped with a detection module 64 to acquire an NMR signal of HF (high-frequency nuclide) and an NMR signal of LF (low-frequency nuclide).

If necessary, a user who performs measurement may cause a control computer 156 to program a time-series sequence with respect to transmission of an LF high-frequency oscillation signal, transmission of an HF high-frequency oscillation signal, reception of an LF high-frequency observation signal, and reception of an HF high-frequency observation signal.

Similar to the first embodiment, an LF transmitter 158 generates an LF high-frequency oscillation signal and controls the phase and the amplitude of the generated LF high-frequency oscillation signal. Subsequently, an LF power amplifier 166 amplifies the LF high-frequency oscillation signal. The amplified LF high-frequency oscillation signal is supplied to the LF coil 86 in the NMR probe 54B. The LF coil 86 irradiates the sample tube 58 and the sample therein with the magnetic field. After the LF high-frequency irradiation, the LF coil 86 detects an NMR signal of the LF nucleus. Subsequently, the detected NMR signal is amplified by a preamplifier 100 and sent to an LF receiver 178. The LF receiver 178 performs predetermined processing on the amplified LF high-frequency reception signal. An A/D converter 180 converts the processed signal into a digital signal and sends it as a digital reception signal to the control computer 156.

An HF transmitter 168 generates an HF high-frequency oscillation signal, and controls the phase and the amplitude of the generated HF high-frequency oscillation signal. Subsequently, an HF power amplifier 176 amplifies the HF high-frequency oscillation signal. The amplified HF high-frequency oscillation signal is supplied, via the HF duplexer 256 and the HF secondary coil 114 in the NMR probe 54B, to the HF primary resonator 88. The HF primary resonator 88 irradiates the sample tube 58 and the sample therein with the magnetic field. After the HF high-frequency irradiation, a relatively small NMR signal of the HF nucleus is output from the sample. The HF primary resonator 88 detects the NMR signal of the HF nucleus and sends it to the HF secondary coil 114. Subsequently, the NMR signal of the HF nucleus is sent, via the HF duplexer 256, to the HF preamplifier 258. The HF preamplifier 258 amplifies the NMR signal to have receivable signal intensity and sends the amplified signal as an HF high-frequency reception signal to an HF receiver 264.

The HF receiver 264 performs wave detection processing and frequency conversion processing on the HF high-frequency reception signal amplified by the HF preamplifier 258, to convert the HF high-frequency reception signal into a reception signal of audio frequency band. An A/D converter 266 converts the reception signal into a digital signal and sends it as a digital reception signal to the control computer 156.

As mentioned above, it is feasible to acquire both the NMR signal of HF and the NMR signal of LF. In the third embodiment, the acquisition of the NMR signal may be performed by irradiating the sample with the LF high-frequency magnetic field to acquire only the NMR signal of LF or by irradiating the sample with the HF high-frequency magnetic field to acquire only the NMR signal of HF, or may be performed by irradiating the sample with both the LF high-frequency magnetic field and the HF high-frequency magnetic field to acquire both of the NMR signal of LF and the NMR signal of HF.

Fourth Embodiment

Figure 16:
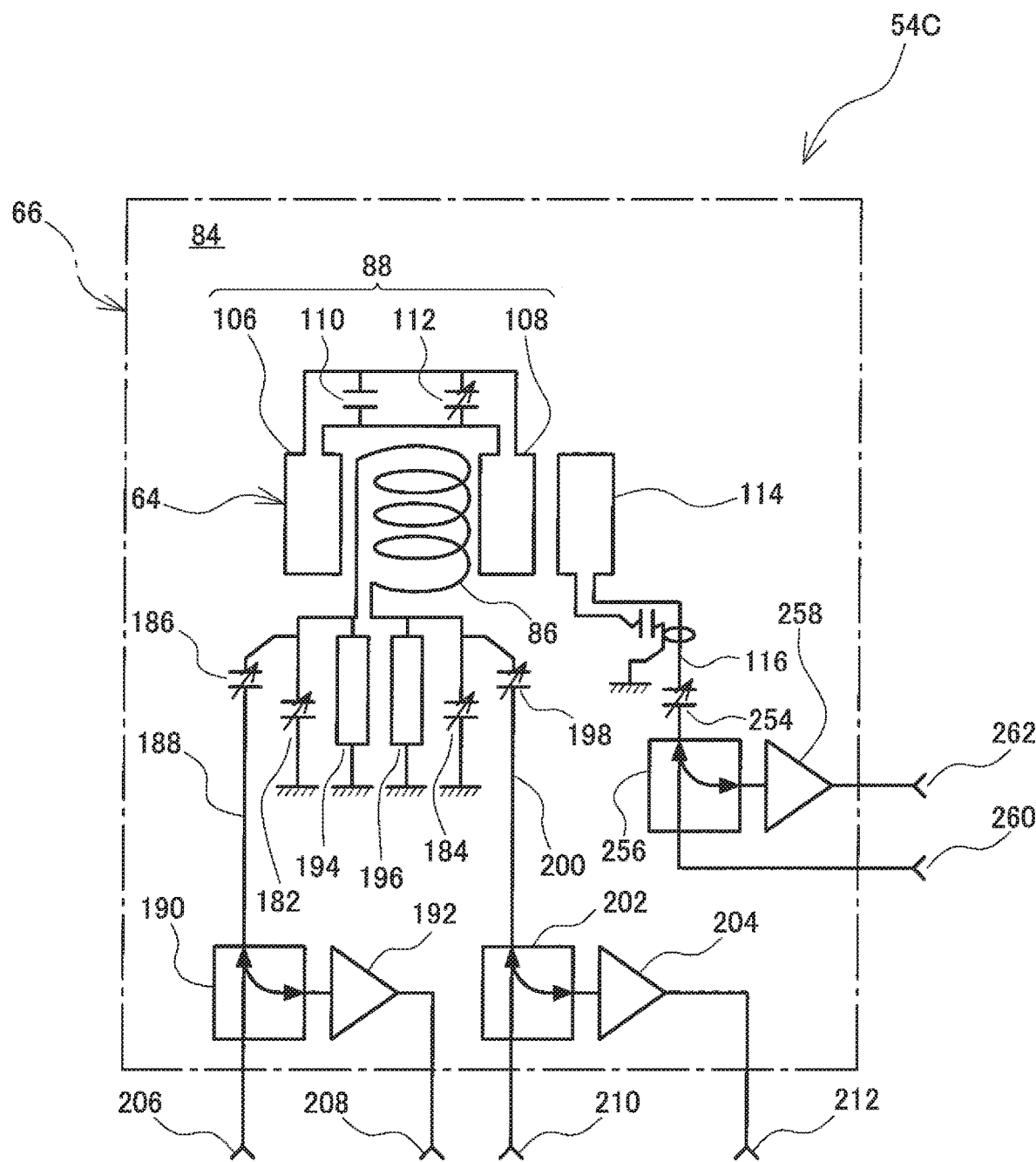
FIG. 16 illustrates a circuit configuration of a detection system cooling NMR probe according to a fourth embodiment.

Hereinafter, a circuit configuration of an NMR probe 54C according to a fourth embodiment will be described in detail with reference to FIG. 16. The NMR probe 54C according to the fourth embodiment is equivalent to a combination of the second embodiment and the third embodiment. Constituent components similar to those described in the first to third embodiments are denoted by the same reference numerals.

Similar to the second embodiment, the NMR probe 54C includes a configuration for acquiring an NMR signal of LF1 and an NMR signal of LF2. Similar to the third embodiment, the NMR probe 54C includes a configuration for acquiring an NMR signal of HF.

Figure 17:
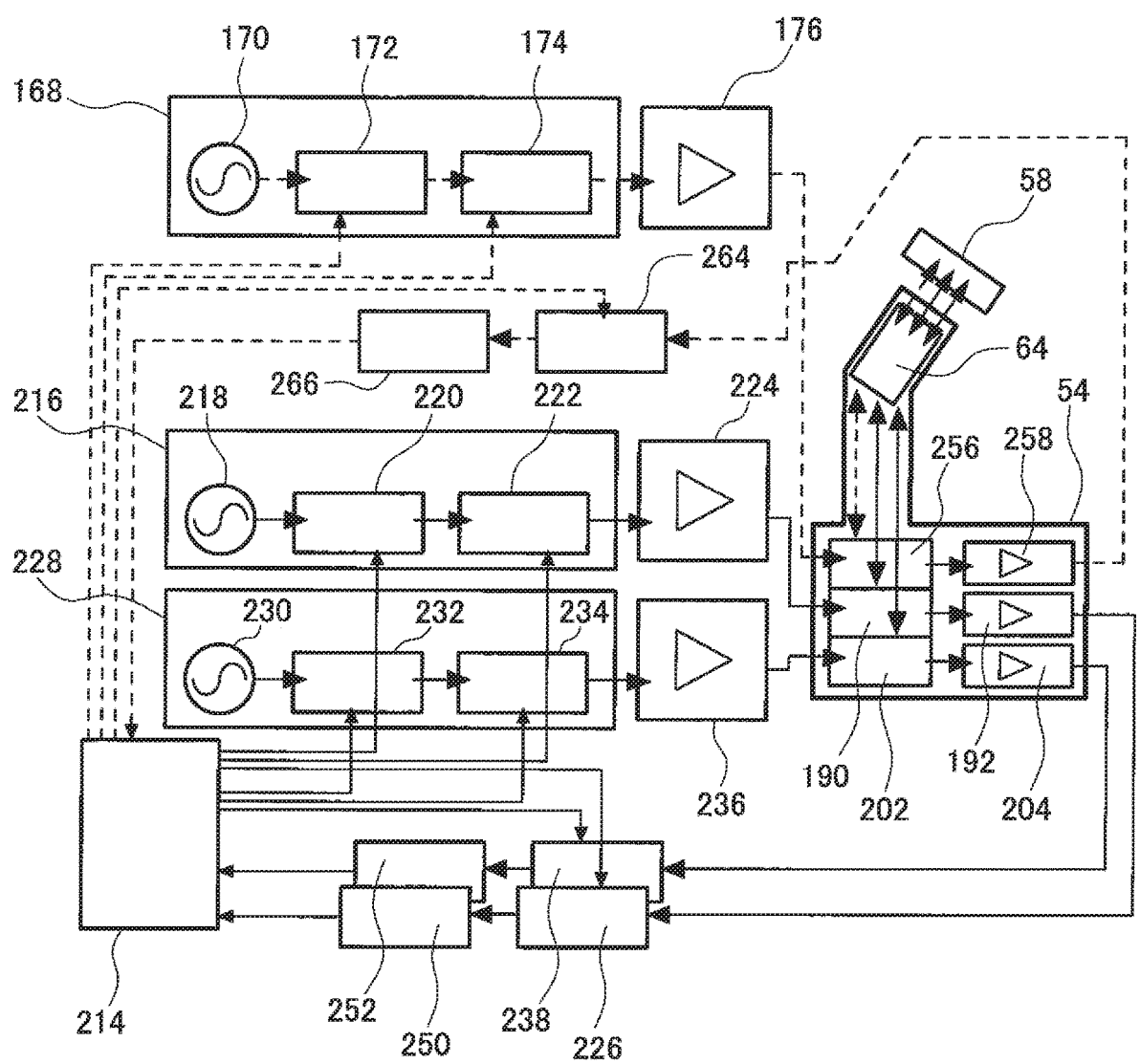
FIG. 17 illustrates a configuration example of an NMR spectrometer system according to the fourth embodiment.

FIG. 17 illustrates an NMR spectrometer system according to the fourth embodiment. The NMR spectrometer system according to the fourth embodiment includes a configuration for acquiring the NMR signal of LF1 and the NMR signal of LF2, which is similar to that described in the second embodiment, and a configuration for acquiring the NMR signal of HF, which is similar to that described in the third embodiment.

According to the fourth embodiment, not only is acquiring the NMR signal of HF feasible, but so is acquiring both the NMR signal of LF1 and the NMR signal of LF2. Needless to say, the acquisition of the NMR signal may be acquiring at least one of the above-mentioned NMR signals.

The above-mentioned first to fourth embodiments may be applied to various pulse sequences (e.g., a sequence including a long-time RF pulse irradiation), such as the CP method, the decoupling method, the DARR method, and the like. The CP method is characterized by performing magnetization transfer from a nuclide strong in magnetic polarization to a nuclide weak in magnetic polarization, with continuous irradiation of 1 to 50 msec. Representative known examples of the decoupling method include the CW method, the TPPM method, the XiX method, and the like. In any method, continuous irradiation of several tens to several hundreds msec is performed. It is essentially desired that the intensity of the magnetic field for irradiation be large (at least 60 kHz to 100 kHz). The DARR method is characterized by strengthening the dipole interaction between spins during rotation of the sample to facilitate the magnetization transfer due to spin diffusion, and the irradiation time is approximately several tens of msec to several seconds. According to the first to fourth embodiments, it is feasible to enhance the ability to cope with the measurement method using high-frequency pulses in which the irradiation time is several msec to several seconds and the repetition time is several seconds (the duty factor is approximately 10%). In other words, it is feasible to prevent vacuum high-frequency discharge deteriorating quantativity of sensitivity and to improve the upper limit of pulse irradiation power.

Figure 18:
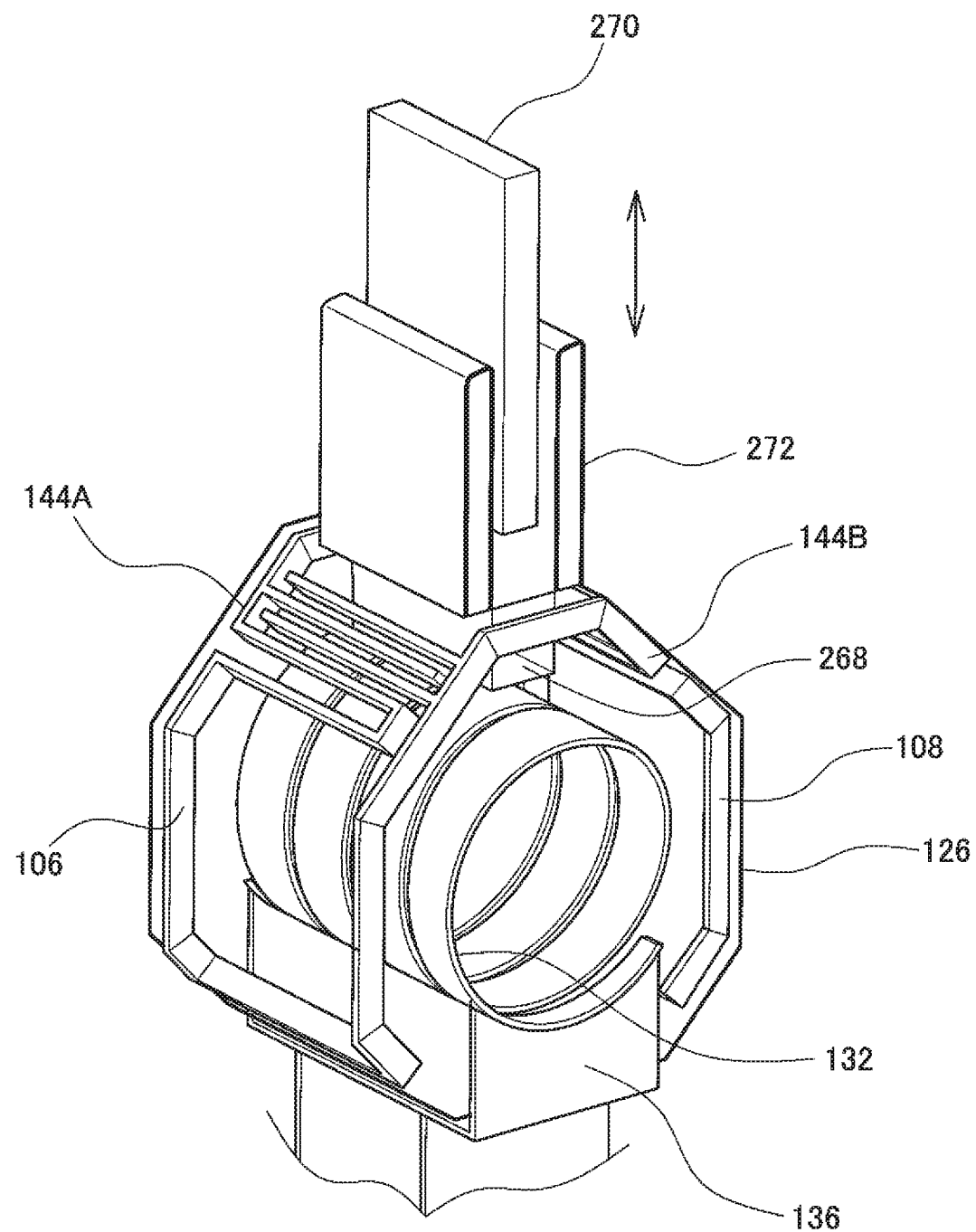
FIG. 18 is a perspective view illustrating a detection module according to a modified embodiment.
Figure 19:
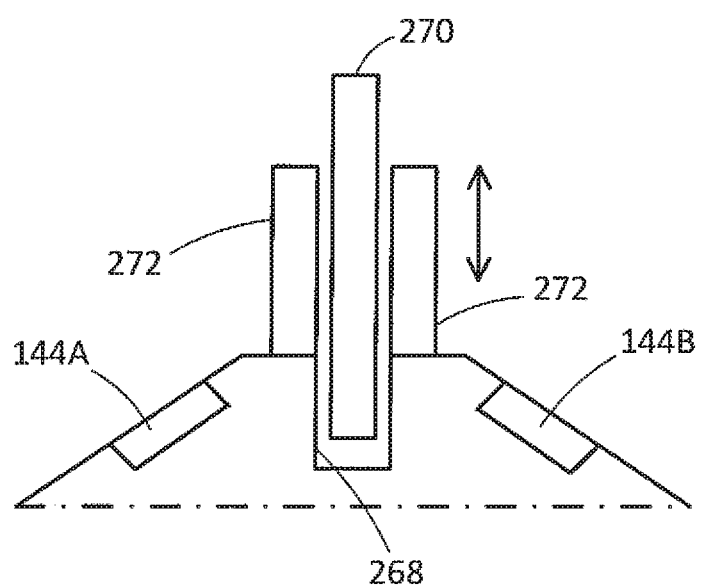
FIG. 19 is a cross-sectional view illustrating a part of a detection module according to a modified embodiment.

Hereinafter, a capacitor part according to a modified embodiment will be described in detail with reference to FIGS. 18 and 19. FIG. 18 is a perspective view illustrating a detection module according to the modified embodiment. FIG. 19 is a cross-sectional view illustrating a part of the detection module according to the modified embodiment, seen from the Y direction. In the modified embodiment, instead of using the above-mentioned capacitor part 144, a pair of capacitor parts 144A and 144B is provided in the detection module. A recess 268 is formed on the top face 126d (see FIG. 8) of the coil mounting section 126. The capacitor part 144A is embedded in the coil mounting section 126 so as to constitute a part of the upper left face 126c (a portion adjacent to the top face 126d). The capacitor part 144B is embedded in the coil mounting section 126 so as to constitute a part of the upper right face 126e (a portion adjacent to the top face 126d). The capacitor parts 144A and 144B are mutually connected via a conductor. A dielectric plate 270 can be taken in and out of the recess 268. The dielectric plate 270 is positioned between the capacitor part 144A and the capacitor part 144B. In addition, a guide 272 capable of regulating the movement of the dielectric plate 270 is provided on the top face 126d. Moving the dielectric plate 270 in an arrow direction along the guide 272 can change the distance between the dielectric plate 270 and the capacitor parts 144A and 144B, thereby changing a stray capacitance of the capacitor parts 144A and 144B to adjust the resonant frequency finely.

According to the modified embodiment, the resonant frequency can be adjusted by using the dielectric plate 270 having a size comparable to that of the recess 268. In other words, it is feasible to set the size of the dielectric plate 270 to be smaller than the dielectric plate 152 (see FIG. 10) according to the above-mentioned embodiment. In addition, according to the modified embodiment, it is feasible to improve the linearlity of tuning range.

The invention claimed is:

1. A magnetic resonance signal detection module provided in a vacuum container to be inserted in a static magnetic field generator and configured to detect a magnetic resonance signal from a sample, comprising:
  an insulator block having a detection hole into which a sample container is inserted;
  a low-frequency nuclide coil provided on an inner surface of the detection hole; and
  a high-frequency nuclide coil embedded in the insulator block in such a way as to surround the low-frequency nuclide coil,
  wherein the high-frequency nuclide coil comprises:
    a Helmholtz coil part including a pair of saddle coils; and
    a tuning capacitor part connecting the pair of saddle coils,
  wherein the pair of saddle coils is provided in such a way as to sandwich the low-frequency nuclide coil.

2. The magnetic resonance signal detection module according to claim 1, wherein the low-frequency nuclide coil and the Helmholtz coil part are arranged in such a manner that a direction of a magnetic field formed by the low-frequency nuclide coil is orthogonal to a direction of a magnetic field formed by the Helmholtz coil part.

3. The magnetic resonance signal detection module according to claim 1, wherein a conductor of the low-frequency nuclide coil and a conductor of the Helmholtz coil part are configured as a coil having a ribbon-like shape, and a flatwise face of a ribbon forming the conductor of the low-frequency nuclide coil and an edgewise face of a ribbon forming the conductor of the Helmholtz coil part face each other.

4. The magnetic resonance signal detection module according to claim 1, further comprising:
  a power supply coil provided outside the vacuum container for supplying electric power to the high-frequency nuclide coil by inductive coupling with the Helmholtz coil part.

5. The magnetic resonance signal detection module according to claim 4, wherein impedance matching is controlled for supplying electric power according to a distance between the power supply coil and the high-frequency nuclide coil.

6. The magnetic resonance signal detection module according to claim 1, further comprising:
  a dielectric provided so as to face the tuning capacitor part,
  wherein tuning of resonant frequency is performed according to a distance between the capacitor part and the dielectric.

7. A magnetic resonance signal detection module provided in a vacuum container to be inserted in a static magnetic field generator and configured to detect a magnetic resonance signal from a sample, comprising:
  an insulator block having a detection hole into which a sample container is inserted;
  a low-frequency nuclide coil provided on an inner surface of the detection hole; and
  a high-frequency nuclide coil embedded in the insulator block in such a way as to surround the low-frequency nuclide coil,
  wherein the high-frequency nuclide coil is embedded in a groove formed in the insulator block, and the high-frequency nuclide coil has a surface exposed from the insulator block and coated with an insulating material.

* * * * *